United States Patent
Kianian

(10) Patent No.: US 7,326,614 B2
(45) Date of Patent: Feb. 5, 2008

(54) SELF ALIGNED METHOD OF FORMING A SEMICONDUCTOR MEMORY ARRAY OF FLOATING GATE MEMORY CELLS WITH BURIED BIT-LINE AND RAISED SOURCE LINE, AND A MEMORY ARRAY MADE THEREBY

(75) Inventor: Sohrab Kianian, Los Altos Hills, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/997,382

(22) Filed: Nov. 23, 2004

(65) Prior Publication Data

US 2005/0104115 A1    May 19, 2005

Related U.S. Application Data

(62) Division of application No. 10/358,601, filed on Feb. 4, 2003.

(60) Provisional application No. 60/369,276, filed on Apr. 1, 2002, provisional application No. 60/370,610, filed on Apr. 5, 2002, provisional application No. 60/370,888, filed on Apr. 5, 2002, provisional application No. 60/391,663, filed on Jun. 25, 2002.

(51) Int. Cl.
    *H01L 21/336* (2006.01)
(52) U.S. Cl. ............ 438/257; 438/259; 257/E21.646
(58) Field of Classification Search .......... 438/257, 438/259; 257/E21.646
    See application file for complete search history.

(56) References Cited

U.S. PATENT DOCUMENTS

| | | | |
|---|---|---|---|
| 4,757,360 A | 7/1988 | Farone | |
| 4,794,565 A | 12/1988 | Wu et al. | |
| 4,882,707 A | 11/1989 | Mizutani | |

(Continued)

FOREIGN PATENT DOCUMENTS

EP      0 389 721 A2      10/1990

(Continued)

OTHER PUBLICATIONS

U.S. Appl. No. 10/757,830, filed Jan. 2004, Yeh et al.

(Continued)

*Primary Examiner*—Michael Lebentritt
*Assistant Examiner*—Stanetta Isaac
(74) *Attorney, Agent, or Firm*—DLA Piper US LLP

(57) ABSTRACT

A method of forming an array of floating gate memory cells, and an array formed thereby, that includes source and drain regions formed in a substrate, and a conductive block of material disposed over the source region. The floating gate is formed as a thin, L-shaped layer of conductive material having a first portion disposed over the channel region and a second portion extending vertically along the conductive block. The control gate includes a first portion disposed adjacent to and insulated from a distal end of the floating gate first portion, and a second portion disposed adjacent to the channel region. A portion of the control gate could extend into a trench formed into the substrate, wherein the drain region is formed underneath the trench, and the channel region has a first portion extending along the trench sidewall and a second portion extending along the substrate surface.

36 Claims, 19 Drawing Sheets

U.S. PATENT DOCUMENTS

| | | | |
|---|---|---|---|
| 4,905,062 A | 2/1990 | Esquivel et al. | |
| 4,931,847 A | 6/1990 | Corda | |
| 4,947,221 A | 8/1990 | Stewart et al. | |
| 5,021,848 A | 6/1991 | Chiu | |
| 5,029,130 A | 7/1991 | Yeh | |
| 5,041,886 A | 8/1991 | Lee | |
| 5,049,515 A | 9/1991 | Tzeng | |
| 5,101,250 A | 3/1992 | Arima et al. | |
| 5,268,319 A | 12/1993 | Harari | |
| 5,338,953 A | 8/1994 | Wake | |
| 5,381,028 A | 1/1995 | Iwasa | |
| 5,429,965 A | 7/1995 | Shimoji | |
| 5,495,441 A | 2/1996 | Hong | |
| 5,544,103 A | 8/1996 | Lambertson | |
| 5,572,054 A | 11/1996 | Wang et al. | |
| 5,638,320 A | 6/1997 | Wong et al. | |
| 5,780,341 A | 7/1998 | Ogura | |
| 5,780,892 A | 7/1998 | Chen | |
| 5,789,293 A | 8/1998 | Cho et al. | |
| 5,796,139 A | 8/1998 | Fukase | |
| 5,808,328 A | 9/1998 | Nishizawa | |
| 5,811,853 A | 9/1998 | Wang | |
| 5,814,853 A | 9/1998 | Chen | |
| 5,943,572 A | 8/1999 | Krautschneider | |
| 6,091,104 A | 7/2000 | Chen | |
| 6,103,573 A | 8/2000 | Harari et al. | |
| 6,140,182 A | 10/2000 | Chen | |
| 6,157,058 A | 12/2000 | Ogura | |
| 6,159,796 A * | 12/2000 | Dietz et al. | 438/257 |
| 6,180,458 B1 | 1/2001 | Krautschneider et al. | |
| 6,222,227 B1 | 4/2001 | Chen | |
| 6,262,917 B1 | 7/2001 | Lee | |
| 6,316,298 B1 | 11/2001 | Lee | |
| 6,316,315 B1 * | 11/2001 | Hofmann et al. | 438/259 |
| 6,521,944 B1 | 2/2003 | Mirgorodski | |
| 6,525,371 B2 * | 2/2003 | Johnson et al. | 257/317 |
| 6,538,275 B2 | 3/2003 | Sugiyama et al. | |
| 6,541,815 B1 * | 4/2003 | Mandelman et al. | 257/315 |
| 6,746,920 B1 * | 6/2004 | Wen et al. | 438/257 |
| 6,756,633 B2 | 6/2004 | Wang et al. | |
| 6,803,273 B1 * | 10/2004 | Ambrose et al. | 438/257 |
| 6,917,069 B2 * | 7/2005 | Kianian et al. | 257/315 |
| 6,952,034 B2 * | 10/2005 | Hu et al. | 257/315 |
| 2002/0045319 A1 * | 4/2002 | Ogura et al. | 438/303 |
| 2002/0055228 A1 * | 5/2002 | Ambrose et al. | 438/257 |
| 2002/0058381 A1 * | 5/2002 | Lee | 438/259 |
| 2002/0127798 A1 * | 9/2002 | Prall | 438/257 |
| 2002/0142543 A1 * | 10/2002 | Lin et al. | 438/257 |
| 2003/0073275 A1 | 4/2003 | Kianian et al. | |

FOREIGN PATENT DOCUMENTS

| | | |
|---|---|---|
| JP | 1-291470 | 11/1989 |
| JP | 3-70179 | 3/1991 |
| JP | 11-220044 | 8/1999 |
| JP | 11-260944 | 9/1999 |
| JP | 2000-269365 | 9/2000 |
| JP | 2001-85544 | 3/2001 |
| JP | 2001217326 | 8/2001 |
| JP | 2001-284473 | 10/2001 |
| JP | 2002-83886 | 3/2002 |

OTHER PUBLICATIONS

U.S. Appl. No. 10/653,015, filed Aug. 2003, Chen et al.

U.S. Appl. No. 10/358,623, filed Feb. 2003, Hu et al.

Hayashi, Fumihiko and Plummer, James D., "A Self-Aligned Split-Gate Flash EEPROM Cell With 3-D Pillar Structure", 1999 Symposium on VLSI Technology Digest of Technical Papers, Center for Integrated System, Stanford University, Stanford, CA 94305, USA, pp. 87-88.

Sze, Simon, "Physics of Semiconductor Devices", 2nd Edition, Wiley-Interscience, Basic Device Characteristics pp. 438-439.

Brown, William D. et al.; "Nonvolatile Semiconductor Memory Technology, A Comprehensive Guide to Understanding And Using NVSM Devices", IEEE Press, pp. 33-34.

Japanese Office Action (English translation) mailed on Jan. 9, 2007 corresponding to the related Japanese Patent Application No. 2003-087103.

* cited by examiner

US 7,326,614 B2

SELF ALIGNED METHOD OF FORMING A SEMICONDUCTOR MEMORY ARRAY OF FLOATING GATE MEMORY CELLS WITH BURIED BIT-LINE AND RAISED SOURCE LINE, AND A MEMORY ARRAY MADE THEREBY

This application is a divisional application of U.S. patent application Ser. No. 10/358,601 filed on Feb. 4, 2003, which claims the benefit of U.S. Provisional Application No. 60/369,276, filed Apr. 1, 2002, of U.S. Provisional Application No. 60/370,610, filed Apr. 5, 2002, of U.S. Provisional Application No. 60/370,888, filed Apr. 5, 2002, and of U.S. Provisional Application No. 60/391,663, filed Jun. 25, 2002.

TECHNICAL FIELD

The present invention relates to a self-aligned method of forming a semiconductor memory array of floating gate memory cells. The present invention also relates to a semiconductor memory array of floating gate memory cells of the foregoing type.

BACKGROUND OF THE INVENTION

Non-volatile semiconductor memory cells using a floating gate to store charges thereon and memory arrays of such non-volatile memory cells formed in a semiconductor substrate are well known in the art. Typically, such floating gate memory cells have been of the split gate type, or stacked gate type.

One of the problems facing the manufacturability of semiconductor floating gate memory cell arrays has been the alignment of the various components such as source, drain, control gate, and floating gate. As the design rule of integration of semiconductor processing decreases, reducing the smallest lithographic feature, the need for precise alignment becomes more critical. Alignment of various parts also determines the yield of the manufacturing of the semiconductor products.

Self-alignment is well known in the art. Self-alignment refers to the act of processing one or more steps involving one or more materials such that the features are automatically aligned with respect to one another in that step processing. Accordingly, the present invention uses the technique of self-alignment to achieve the manufacturing of a semiconductor memory array of the floating gate memory cell type.

There is a constant need to shrink the size of the memory cell arrays in order to maximize the number of memory cells on a single wafer. It is well known that forming memory cells in pairs, with each pair sharing a single source region, and with adjacent pairs of cells sharing a common drain region, reduces the size of the memory cell array. However, a large area of the array is typically reserved for the bit-line connection to the drain regions. The bit-line area is often occupied by the contact openings between memory cell pairs, and the contact to wordline spacing, which strongly depends upon lithography generation, contact alignment and contact integrity. In addition, significant space is reserved for the word-line transistor, the size of which is set by lithography generation and junction scaling.

Traditionally, floating gates are formed with a sharp edge facing a control gate to enhance Fowler-Nordheim tunneling, which is used to move electrons off of the floating gate during an erase operation. The sharp edge is typically formed by oxidizing or partially etching the top surface of the floating gate poly in an uneven manner. However, as the dimensions of the floating gate get smaller, this sharp edge can be more difficult to form in this manner.

There is also a need to improve the programming efficiency of memory cell array. In conventional programming schemes, the electrons in the channel region flow in a path parallel to the floating gate, where a relatively small number of the heated electrons are injected onto the floating gate. The estimated program efficiency (number of electrons injected compared to total number of electrons) is estimated at about $1/1000$.

It is known to form memory cell elements over non-planar portions of the substrate. For example, U.S. Pat. No. 5,780, 341 (Ogura) discloses a number of memory device configurations that includes a step channel formed in the substrate surface. While the purpose of the step channel is to inject hot electrons more efficiently onto the floating gate, these memory device designs are still deficient in that it is difficult to optimize the size and formation of the memory cell elements as well the necessary operational parameters needed for efficient and reliable operation.

There is a need for a non-volatile, floating gate type memory cell array with significant cell size reduction without compromising the functionality or reliability of the floating gate memory.

SUMMARY OF THE INVENTION

The present invention solves the above mentioned problems by providing a self aligned method of forming memory cells with reduced size and by providing a novel floating gate structure, and a memory cell array formed thereby.

The present invention is an electrically programmable and erasable memory device that includes a substrate of semiconductor material having a first conductivity type and a surface, first and second spaced-apart regions formed in the substrate and having a second conductivity type, with a channel region defined in the substrate therebetween having a first portion and a second portion, an electrically conductive floating gate having first and second elongated portions joined together at proximal ends thereof in a non-linear manner, wherein the floating gate first portion extends along and is insulated from the channel region second portion for controlling a conductivity of the channel region second portion, and wherein the floating gate second portion is positioned for capacitive coupling with the first region, and an electrically conductive control gate disposed adjacent to and insulated from the channel region first portion for controlling a conductivity of the channel region first portion.

In another aspect of the present invention, an array of electrically programmable and erasable memory devices includes a substrate of semiconductor material having a first conductivity type and a surface, and spaced apart isolation regions formed on the substrate which are substantially parallel to one another and extend in a first direction, with an active region between each pair of adjacent isolation regions. Each of the active regions includes a plurality of memory cells. Each of the memory cells includes first and second spaced-apart regions formed in the substrate and having a second conductivity type, with a channel region defined in the substrate therebetween having first and second portions, an electrically conductive floating gate having first and second elongated portions joined together at proximal ends thereof in a non-linear manner, wherein the floating gate first portion extends along and is insulated from the channel region second portion for controlling a conductivity of the channel region second portion, and wherein the floating gate second portion is positioned for capacitive coupling with the first region, and an electrically conductive control gate disposed adjacent to and insulated from the channel region first portion for controlling a conductivity of the channel region first portion.

In yet another aspect of the present invention, a method of forming a semiconductor memory cell includes the steps of forming first and second spaced-apart regions in a semiconductor substrate, with a channel region defined in the substrate therebetween having a first portion and a second portion, wherein the substrate has a first conductivity type and a surface, and the first and second regions have a second conductivity type, forming an electrically conductive floating gate having first and second elongated portions joined together at proximal ends thereof in a non-linear manner, wherein the floating gate first portion is formed to extend along and be insulated from the channel region second portion for controlling a conductivity of the channel region second portion, and wherein the floating gate second portion is positioned for capacitive coupling with the first region, and forming an electrically conductive control gate disposed adjacent to and insulated from the channel region first portion for controlling a conductivity of the channel region first portion.

In yet one more aspect of the present invention, a method of forming an array of semiconductor memory cells includes the steps of forming a plurality of first and second spaced-apart regions of a second conductivity type in a semiconductor substrate of a first conductivity type, with a plurality of channel regions each defined in the substrate between one of the first regions and one of the second regions, wherein each channel region includes a first portion and a second portion, and wherein the substrate has a surface, forming a plurality of electrically conductive floating gates each having first and second elongated portions joined together at proximal ends thereof in a non-linear manner, wherein each of the floating gate first portions is formed to extend along and be insulated from one of the channel region second portions for controlling a conductivity of the one channel region second portion, and wherein each of the floating gate second portions is positioned for capacitive coupling with one of the first regions; and forming a plurality of electrically conductive control gates each disposed adjacent to and insulated from one of the channel region first portions for controlling a conductivity of the one channel region first portion.

Other objects and features of the present invention will become apparent by a review of the specification, claims and appended figures.

DETAILED DESCRIPTION OF THE PREFERRED EMBODIMENTS

The method of the present invention is illustrated in FIGS. 1A-1K, and begins with a semiconductor substrate 10, which is preferably of P type and is well known in the art. The thicknesses of the layers described below will depend upon the design rules and the process technology generation. What is described herein is for the 0.11 micron process. However, it will be understood by those skilled in the art that the present invention is not limited to any specific process technology generation, nor to any specific value in any of the process parameters described hereinafter.

Figure 1A:
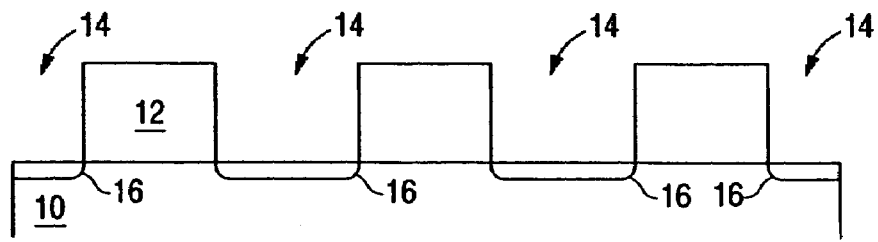
FIGS. 1A-1K are cross sectional views of a semiconductor structure showing in sequence the steps in the processing of the semiconductor structure in the formation of an array of non-volatile floating gate memory cells of the present invention.

As shown in FIG. 1A, a relatively thick layer of insulating material 12, such as silicon nitride (hereinafter "nitride") having a thickness approximately 1000-2000 Å, is formed on substrate 10 by any well known deposition technique (e.g. chemical vapor deposition—CVD). A plurality of parallel first trenches 14 are formed in the nitride layer 12 by applying a photo resist (masking) material on the nitride layer 12, and then performing a masking step to remove the photo resist material from selected parallel stripe regions. An anisotropic nitride etch is used to remove the exposed portions of nitride layer 12 in the stripe regions, leaving first trenches 14 that extend down to and expose portions of substrate 10. Suitable ion implantation is then made across the surface of the structure to form first regions (source regions) 16 in the exposed substrate portions at the bottom of first trenches 14. The source regions 16 extend in parallel lines that are self aligned to the first trenches 14. The resulting structure is shown in FIG. 1A, with trenches 14 defined between blocks of the nitride 12.

Figure 1B:
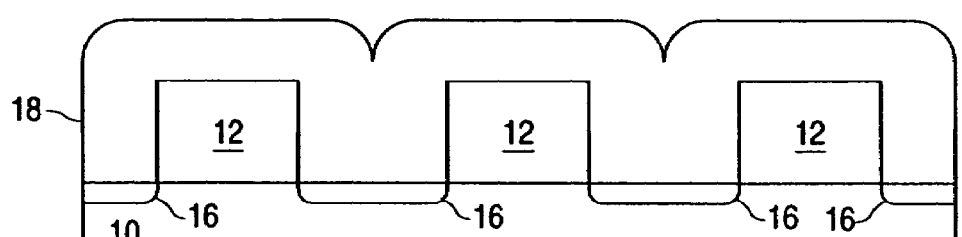
Figure 1C:
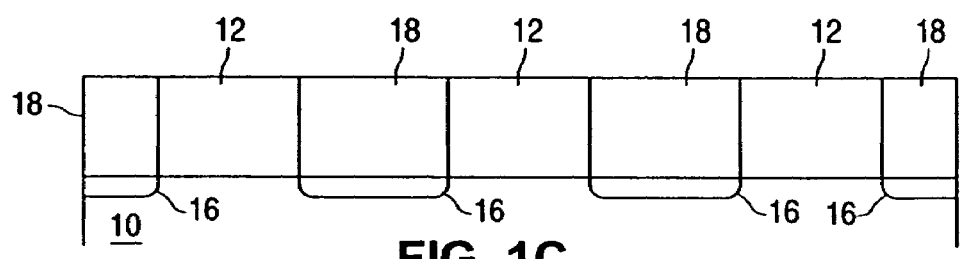

A layer of polysilicon 18 (hereinafter "poly") is then deposited over the structure, which fills trenches 14, as shown in FIG. 1B. A planarization poly etch process (e.g. chemical-mechanical polishing—CMP) is used to etch the poly layer 18 down even with the tops of nitride blocks 12, which are used as the etch stop. The resulting structure is shown in FIG. 1C, where blocks 18 of polysilicon are separated by blocks 12 of nitride.

Figure 1D:
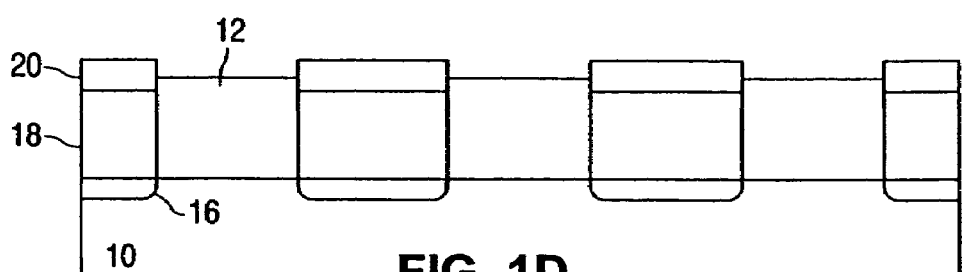
Figure 1E:
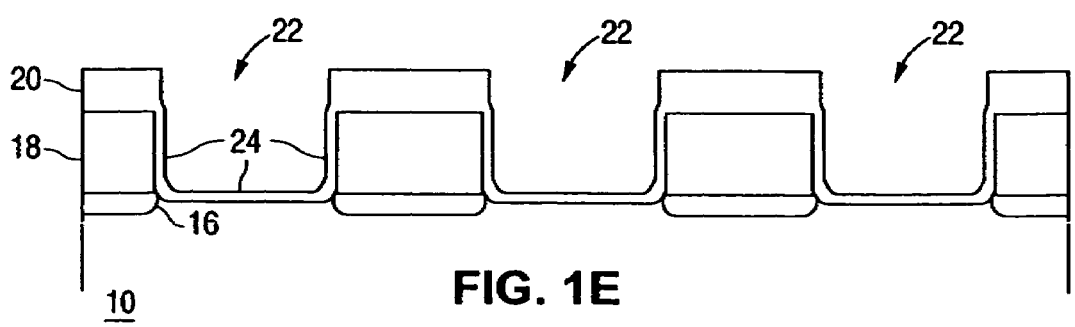

The structure is then subjected to a thermal oxidation process, which forms a layer of silicon dioxide 20 (hereinafter "oxide") on the exposed top surfaces of poly blocks 18, as illustrated in FIG. 1D. A nitride etch process follows to remove nitride blocks 12, leaving second trenches 22 defined between the poly blocks 18 and extending down to the substrate 10. A thermal oxidation process follows to form a thin layer of oxide 24 on exposed surfaces of poly blocks 18 and substrate 10 (inside second trenches 22). The resulting structure is shown in FIG. 1E.

Figure 1F:
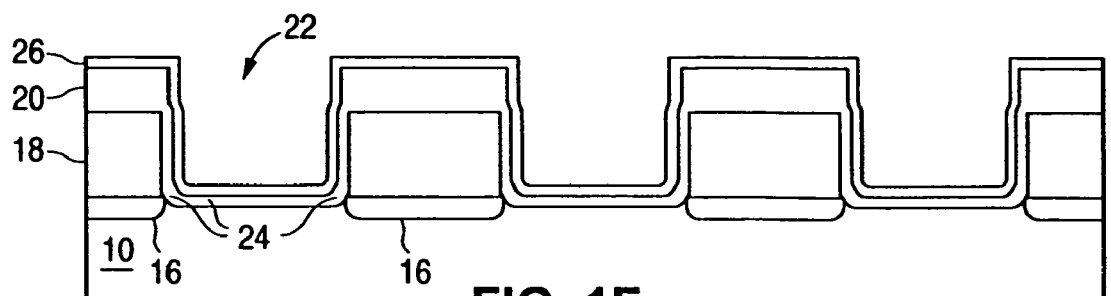
Figure 1G:
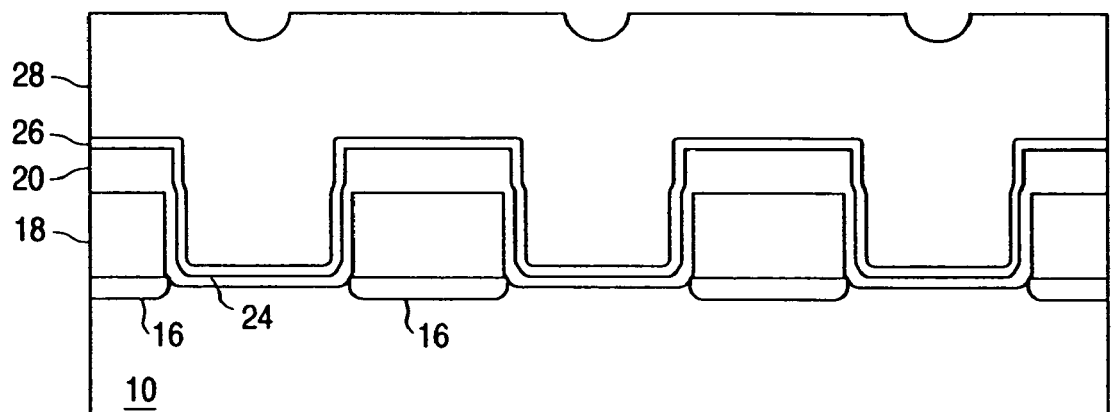
Figure 1H:
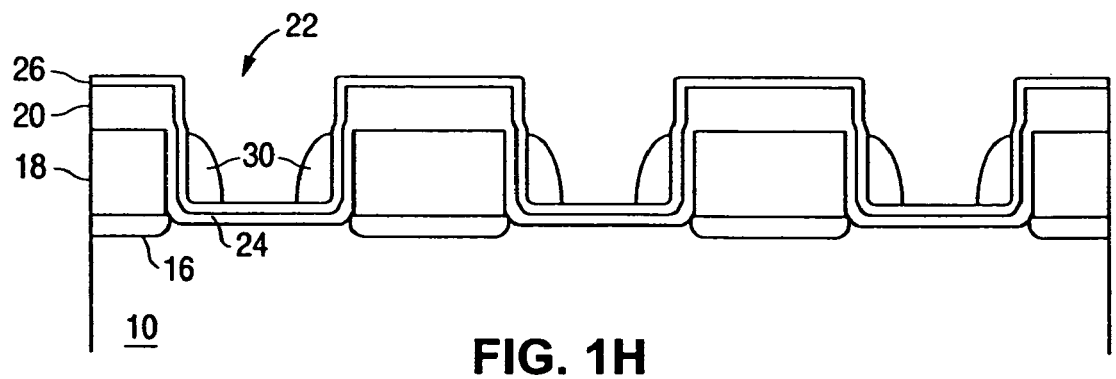

Next, a thin poly layer 26 is formed over the structure, as shown in FIG. 1F. The thickness of poly layer 26 (e.g. 30-500 Å thick) dictates the eventual thickness of the floating gates for the final memory cell device. Insulating spacers 30 are then formed along the side wall surfaces of second trenches 22. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure. Spacers 30 can be formed of any dielectric material, such as oxide, nitride, etc. In the present embodiment, insulating spacers 30 are formed of oxide by depositing a thick layer 28 of oxide (e.g. ~1000 Å thick) over the entire structure (as shown in FIG. 1G), followed by an anisotropic oxide etch process, such as the well known Reactive Ion Etch (RIE), to remove the deposited oxide layer 28, except for spacers 30, as shown in FIG. 1H.

Figure 1I:
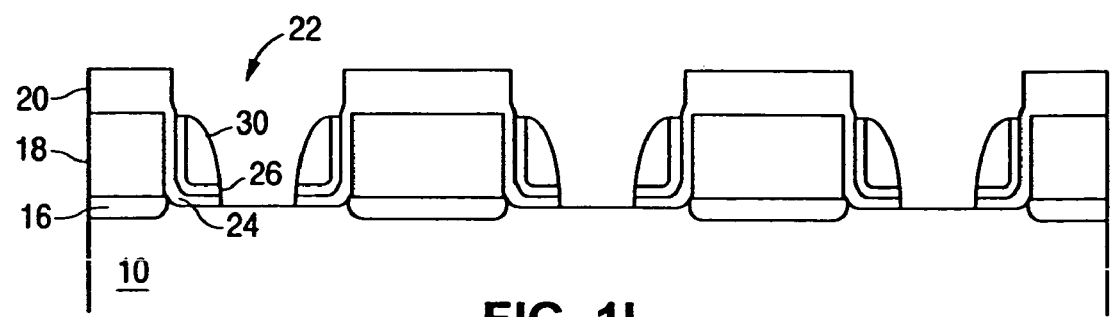

A poly etch is then performed to remove the exposed portions of poly layer 26 (i.e. those portions not protected by oxide spacers 30). A controlled oxide etch is then performed to remove the exposed portions of oxide layer 24 at the bottom of second trenches 22, leaving portions of the substrate 10 exposed between oxide spacers 30. Some of the oxide layer 20 and oxide spacers 30 are also consumed by this oxide etch. The resulting structure is shown in FIG. 1I.

Figure 1J:
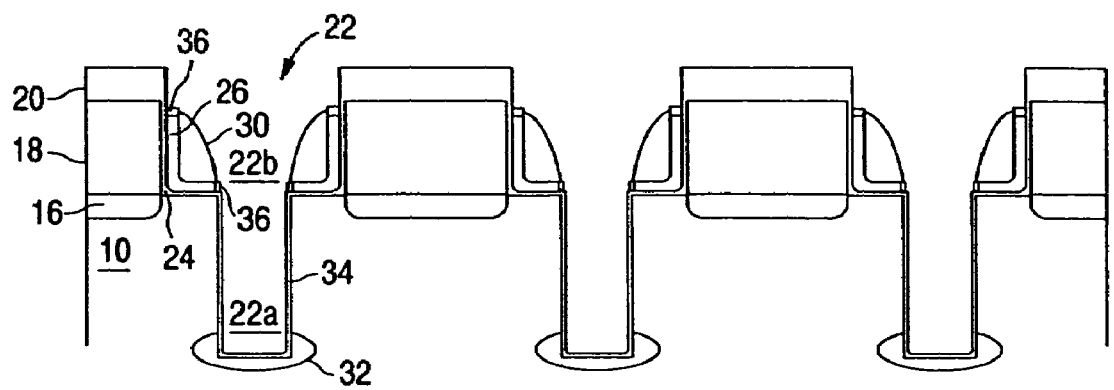

A silicon etch process is used to remove portions of substrate 10 left exposed at the bottom of second trenches 22 and in-between oxide spacers 30. This etch process extends second trenches 22 down into the substrate 10 (preferably down to a depth of approximately one feature size deep, e.g. about 0.11 um deep with 0.11 um technology), where lower portions 22a of second trenches 22 formed in substrate 10 have a width corresponding to the separation of oxide spacers 30 (in upper portions 22b of second trenches 22). Suitable ion implantation is once again made across the entire surface of the structure. The ion implantation forms second regions 32 (buried bit-line drain regions) in the substrate 10 underneath second trenches 22. A thermal oxidation process is next, which forms an oxide layer 34 on the exposed substrate sidewalls of the second trenches 22, and an oxide layer 36 on the exposed ends of poly layer 26. The resulting structure is shown in FIG. 1J. As described later, oxide layer 36 forms the gate oxide material having a thickness that permits Fowler-Nordheim tunneling therethrough. This gate oxide can also be formed using both thermally grown and deposited oxide.

Figure 1K:
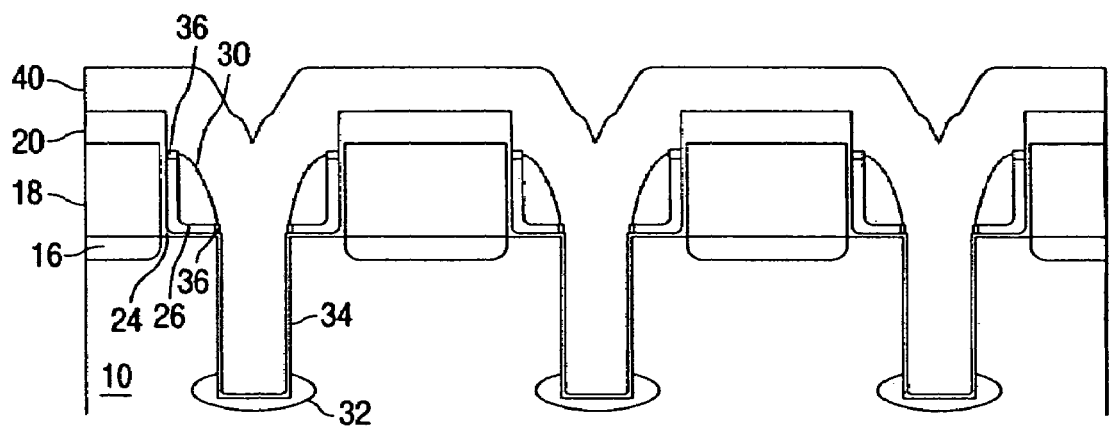

A thick poly layer 40 is next deposited over the structure, filling second trenches 22, as shown in FIG. 1K. Poly layer 40 can be doped by ion implant, or by in-situ process. An optional layer (not shown) of metalized silicon (polycide) can be formed on top of poly layer 40 by depositing a metal such as tungsten, cobalt, titanium, nickel, platinum, or molybdenum over the structure, and then annealing the structure to permit the hot metal to flow and to seep into the top portion of poly layer 40 to form the conductive layer of polycide.

Figure 1L:
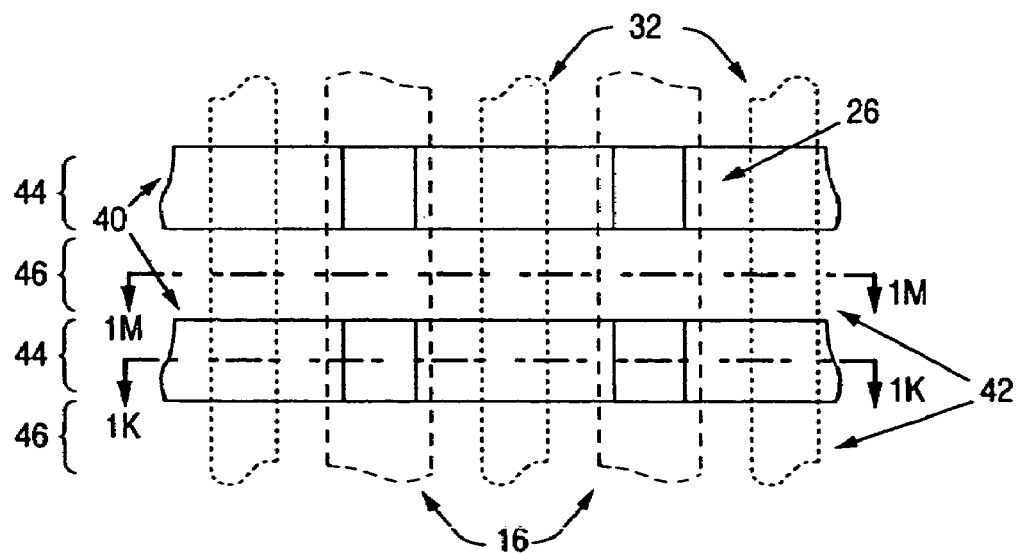
FIG. 1L is a top view showing the active and inactive regions, and the intersection thereof with the source and bit lines, formed by the process of the present invention.
Figure 1M:
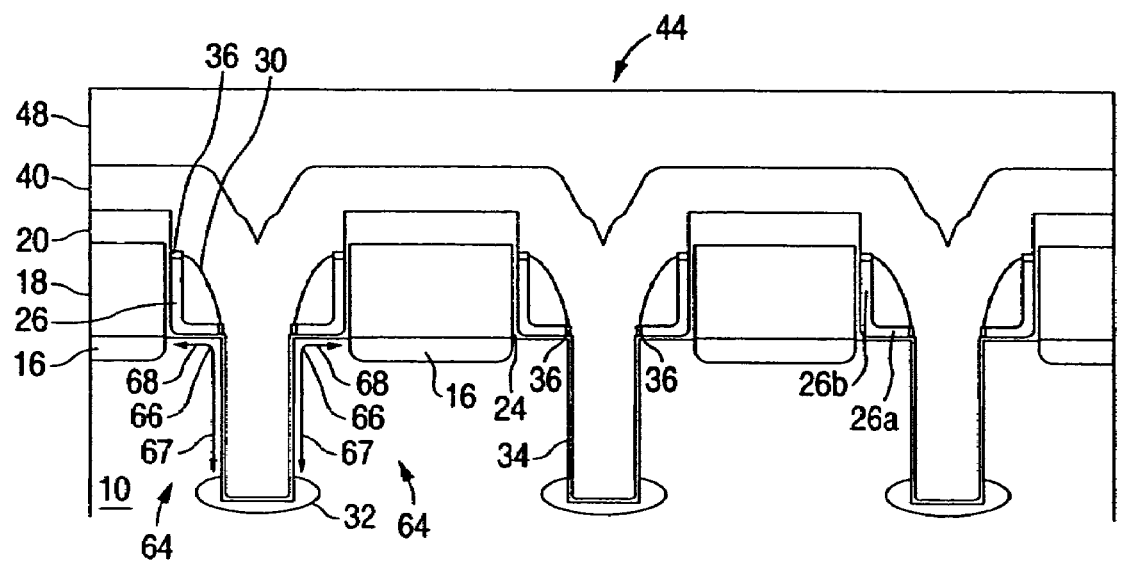
FIG. 1M is a cross sectional view showing the next step(s) in the processing of the active regions formed by the process of the present invention.
Figure 1N:
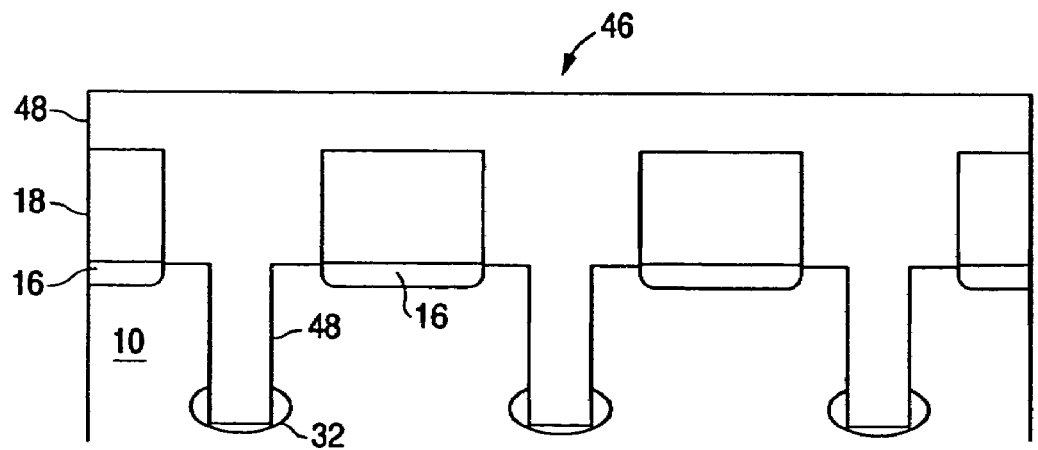
FIG. 1N is a cross sectional view showing the processing of the inactive regions formed by the process of the present invention.

Thus far, the structure shown in FIG. 1K is formed with one masking step, with second trenches 22 extending in one direction. Parallel active and inactive stripe regions, that extend across and are perpendicular to the one direction of the second trenches 22, are formed in the following manner. A photo resist material is applied to the structure shown in FIG. 1K, and a masking step is performed to selectively remove the photo resist material from parallel stripe regions 42, as shown in FIG. 1L. This masking step defines alternating parallel active regions 44 (in which memory cells are formed) and inactive isolation regions 46 (in which no memory cells are formed). A series of etch processes are then performed, which do not affect the active regions 44 (protected by the photo resist material). First, a (dry) poly etch is performed to remove the exposed poly layer 40 in the inactive regions 46, followed by an oxide etch to remove oxide layers 20/34/36 and spacers 30 from inactive regions 46. A controlled poly etch follows, which removes the poly layer 26 (and consumes a small amount of poly blocks 18) in the inactive regions 46. After the photo resist material in the active regions 48 is removed, a thick oxide deposition step covers both the active and inactive regions 44/46 with a thick oxide layer 48. An oxide CMP planarization process is used to planarize the top surface of the oxide layer 48. The final active region structure is illustrated in FIG. 1M, and the final inactive region structure is illustrated in FIG. 1N.

Figure 2A:
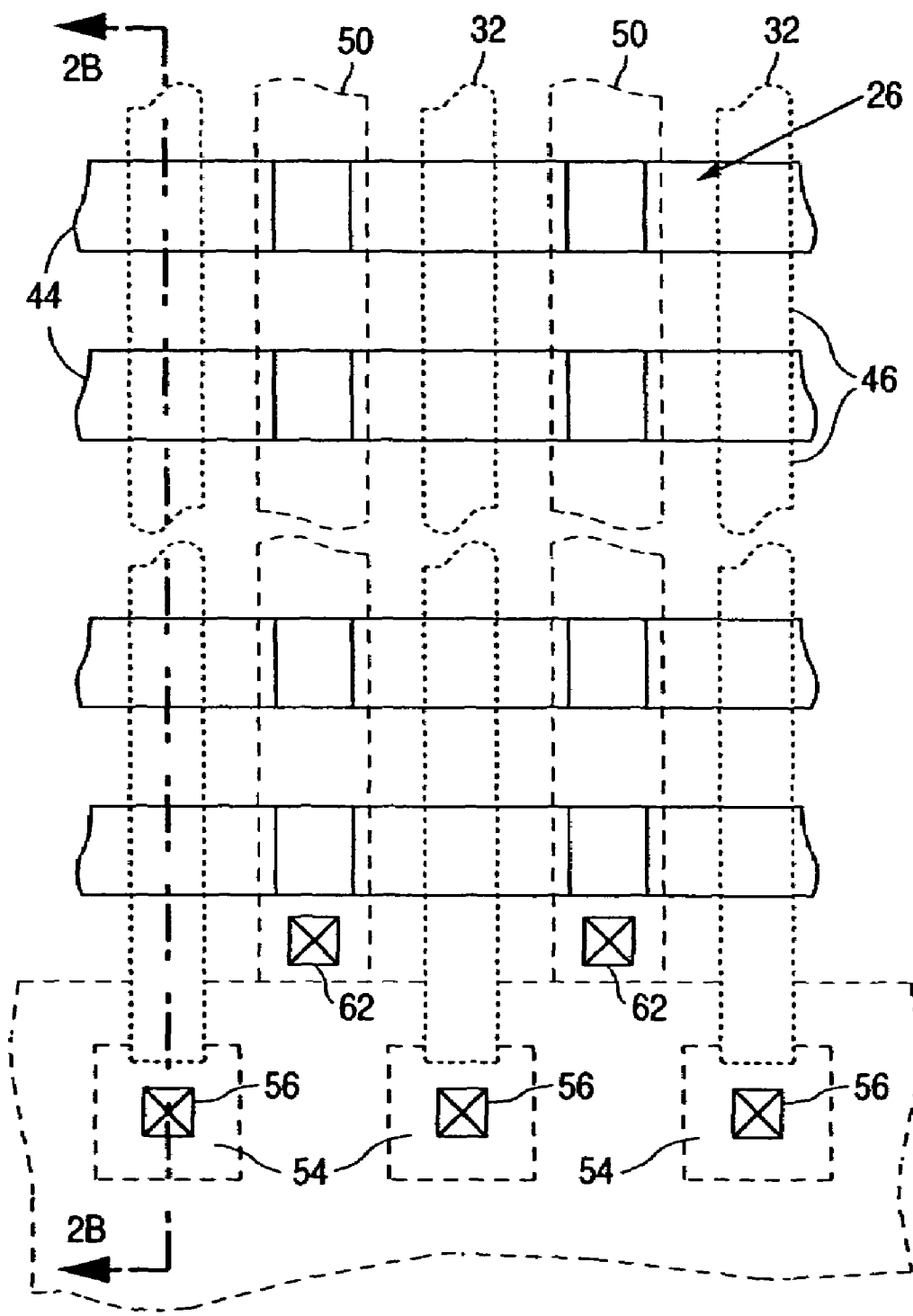
FIG. 2A is a top view showing the active and inactive regions, the intersection thereof with the source and bit lines, and the bit strap implant regions, formed by the process of the present invention.
Figure 2B:
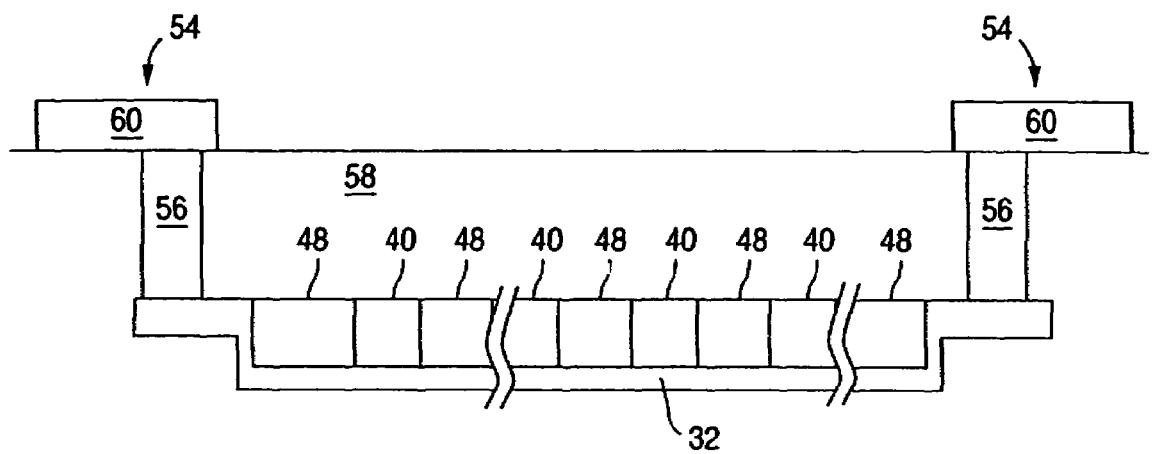
FIG. 2B is a cross sectional view of one of the second trenches, including the bit strap implant areas of the present invention.

FIG. 2A illustrates a top view of the resulting memory cell array, which includes rows of alternating active regions 44 and inactive regions 46, and columns of alternating source line regions 50 (which include source regions 16 and poly blocks 18 electrically connected thereto) and drain regions 32 (also called bit-line regions) formed under trenches 22, that extend in the column direction across the active and inactive regions 44/46. As shown in FIGS. 2A and 2B, at one edge of the array, bit-line strap implant areas 54 are formed in which the second (buried bit-line) region 32 rises up to the surface of the silicon substrate 10. There are several ways to form the rising portions of second region 32. A mask is used to cover the structure except for the gap between the buried and surface portions of second region 32. An implant step is performed wherein the implant energy is selected so that the implanted area joins the buried and surface portions of second region 32. Alternately, a large angle implant can be used to form second regions 32 at the bottom of trenches 22, which will also create the rising portions of second region 32 up to the substrate surface.

Contacts 56 (e.g. metal) are formed over the substrate 10 to make electrical contact with the raised portions of second (buried bit-line) regions 32. Contacts 56 are preferably formed by depositing passivation, such as BPSG 58, over the entire structure. A masking step is performed to define etching areas over the raised portions of the second (buried bit-line) regions 32. The BPSG 58 is selectively etched in the masked regions to create contact openings, which are then filled with a conductor metal 56 by metal deposition and planarization etch-back. Bit line connectors 60 are added by metal masking over the BPSG 58, to connect to contacts 56. Metal contacts 62 are also formed in the same manner in one or more of the inactive regions 46 to connect with the source line regions 50, which includes an oxide etch to remove portions of oxide layer 48 disposed over the poly block 18. It should be noted that strap implant areas can be formed at the ends of the memory arrays, and/or at one or more intermediate locations throughout the memory cell array.

Figure 3:
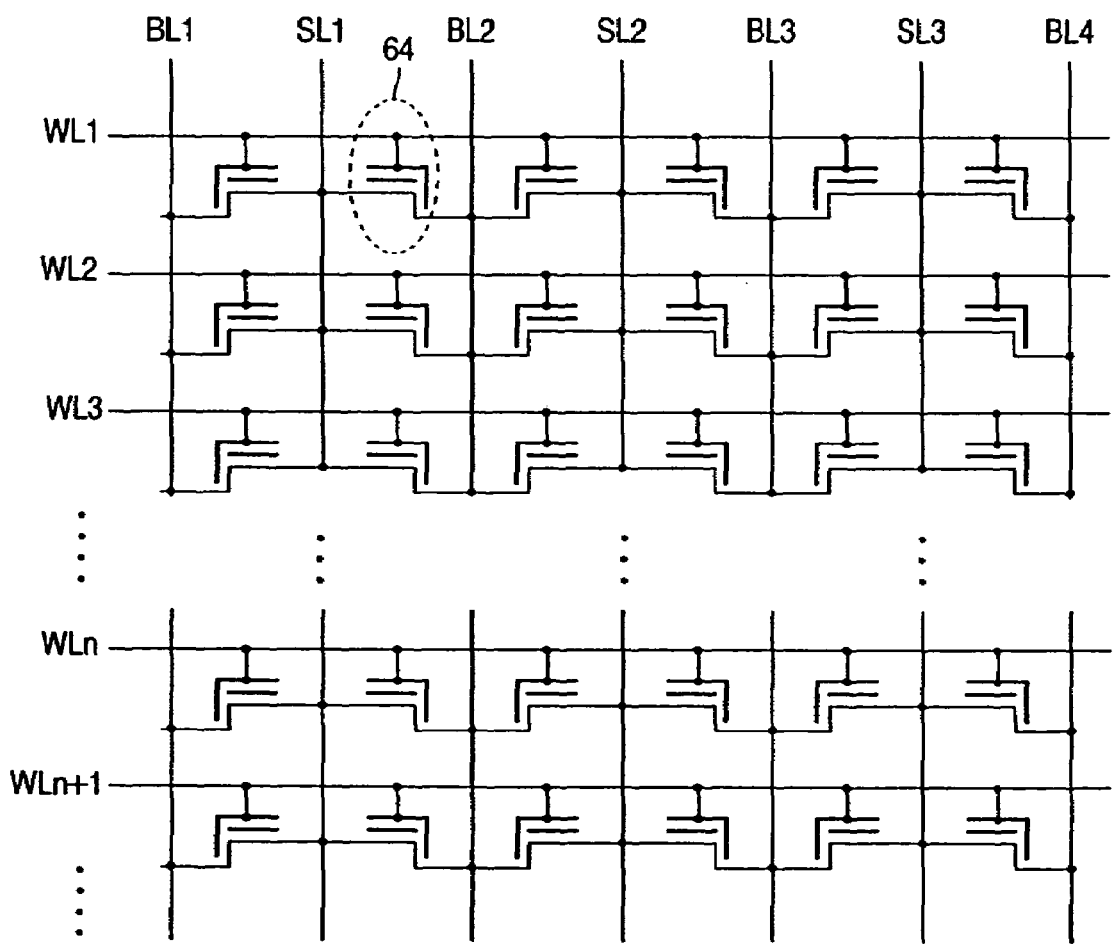
FIG. 3 is a schematic diagram of the memory cell array of the present invention, with control gate transistor portions formed in the trench side-wall areas schematically shown as vertical gates.

FIG. 3 is a schematic circuit diagram of the memory cell array formed by the above described process. There are a plurality of memory cells 64 arranged in rows and columns. The rows of word lines (WL1, WL2, WL3, . . . WLn+1) correspond to the stripes of (WL) poly layer 40 that extend along the row length of the active regions 44. The alternating columns of bit-lines (BL1, BL2, . . . ) and source lines (SL1, SL2 . . . ) correspond to the buried bit line regions 32 and the source line regions 16 (and poly blocks 18 connected thereto), respectively, formed in the substrate that traverse the rows of active regions 44.

FIG. 1M illustrates the final structure of the memory cells 64 formed in the active regions 44. First and second regions 16/32 form the source and drain for each cell (although those skilled in the art know that source and drain can be switched during operation). First regions 16 (with poly block 18 connected thereto) and second regions 32 can also be referred to as source lines and bit lines, respectively, given that they continuously extend across all the active and inactive regions. L-shaped poly layer 26 constitutes the floating gate, and the portions of poly layer 40 disposed in second trenches 22 and over floating gates 26 constitute the control gate for each of the memory cells. The channel region 66 for each memory cell is the surface portion of the substrate that is in-between the source and drain 16/32. Each channel region 66 has two portions joined together at a substantially orthogonal angle, with a vertical portion 67 extending along the vertical wall of (filled) second trench 22 and a horizontal portion 68 extending between the second trench 22 and the source region 16.

Each floating gate 26 is formed of an L-shaped thin layer of polysilicon that includes a pair of orthogonally oriented elongated portions 26a/26b joined together at their proximal ends. Floating gate portion 26a extends substantially parallel to and insulated from the substrate surface. Floating gate portion 26b extending substantially parallel to and insulated from the vertical surface of poly block 18. Each of the floating gate portions 26a/26b has a distal end that terminates in a thin tip portion that directly faces a different portion of the adjacent control gate 40, thus providing two separate lines for Fowler-Nordheim tunneling to the control gate 40. These tips are effectively sharp given the thinness of the poly layer 26, and are sharpened even more by the short oxidation step used to form oxide 36.

As illustrated in the FIG. 1M, the process of the present invention forms pairs of memory cells that mirror each other, with a memory cell 64 formed on each side of the second trenches 22 that share a common bit-line region 32. Similarly, each source line region 16 is shared between adjacent memory cells from different mirror sets of memory cells. For each active region, the poly layer 40 extends along and forms the control gate for all the memory cells in that active region.

Memory Cell Operation

The operation of the memory cells will now be described. The operation and theory of operation of such memory cells are also described in U.S. Pat. No 5,572,054, whose disclosure is incorporated herein by reference with regard to the operation and theory of operation of a non-volatile memory cell having a floating gate and a control gate, floating gate to control gate tunneling, and an array of memory cells formed thereby.

To initially erase a selected memory cell 64 in any given active region 44, a ground potential is applied to both its source 16 and drain 32. A high-positive voltage (e.g. on the order of +12 volts) is applied to the control gate 40. Electrons on the floating gate 26 are induced through the Fowler-Nordheim tunneling mechanism to tunnel from the distal ends of floating gate portions 26a/26b, through the oxide layer 36, and to the control gate 40, leaving the floating gate 26 positively charged. Tunneling is enhanced by the sharpness of the tips of floating gate portions 26a/26b. It should be noted that since the control gate 40 runs along the length of the active region 44, the entire -row of memory cells 64 in the selected active region 44 is 'erased'.

When a selected memory cell 64 is desired to be programmed, a small voltage (e.g. 0.5 to 1.0 V) is applied to its drain region 32. A positive voltage level in the vicinity of the threshold voltage of the MOS structure defined by the control gate 40 (e.g. on the order of approximately +1.8 volts) is applied to its control gate 40. A positive high voltage (e.g. on the order of 5-9 volts) is applied to its source region 16. Electrons generated by the drain region 32 will flow towards the source region 16 through the deep depletion vertical portion 67 of the channel region 66. As the electrons reach the channel region horizontal portion 68, they will see the high potential of floating gate portion 26a (because the floating gate portion 26b is strongly voltage/capacitively coupled to the positively charged poly block 18 electrically connected to the source region 16). The electrons will accelerate and become heated, with most of them being injected into and through the insulating layer 24 and onto the floating gate 26. Ground potential or Vdd (approximately 1.2 to 3.3 volts depending upon the power supply voltage of the device) are applied to the source regions 16 and drain regions 32, respectively, for memory cell columns not containing the selected memory cell 64, as well as to the control gates 40 for memory cell rows not containing the selected memory cell 64. Thus, only the memory cell 64 in the selected row and column is programmed.

The injection of electrons onto the floating gate 26 will continue until the reduction of the charge on the floating gate portion 26a can no longer sustain a high surface potential along the horizontal channel region portion 68 to generate hot electrons. At that point, the electrons or the negative charges in the floating gate 26 will decrease the electron flow from the drain region 32 onto the floating gate 26.

Finally, to read a selected memory cell 64, ground potential is applied to its source region 16. Read voltages are applied to its drain region 32 (e.g. approximately +1 volt) and its control gate 40 (e.g. approximately 1.2 to 3.3 volts depending upon the power supply voltage of the device). If the floating gate 26 is positively charged (i.e. the floating gate is discharged of electrons), then the horizontal portion 68 of the channel region 66 (directly underneath the floating gate 26) is turned on. When the control gate 40 is raised to the read potential, the vertical portion 67 of the channel region 66 (directly adjacent the control gate 40) is also turned on. Thus, the entire channel region 66 will be turned on, causing electrons to flow from the source region 16 to the drain region 32. This would be the "1" state.

On the other hand, if the floating gate 26 is negatively or neutrally charged, the horizontal portion 68 of the channel region 66 (directly below the floating gate portion 26a) is either weakly turned on or is entirely shut off. Even when the control gate 40 and the drain region 32 are raised to the read potentials, little or no current will flow through horizontal portion 68 of channel region 66. In this case, either the current is very small compared to that of the "1" state or there is no current at all. In this manner, the memory cell 64 is sensed to be programmed at the "0" state. Ground potential is applied to the source/drain regions 16/32, and control gates 44 for non-selected columns and rows so only the selected memory cell 64 is read.

The memory cell array includes peripheral circuitry including conventional row address decoding circuitry, column address decoding circuitry, sense amplifier circuitry, output buffer circuitry and input buffer circuitry, which are well known in the art.

The present invention provides a memory cell array with reduced size and superior program efficiency. Memory cell size is reduced significantly because the bit line regions 32 are buried inside the substrate 10, and are self aligned to the second trenches 22, where space is not wasted due to limitations in the lithography generation, contact alignment and contact integrity. Program efficiency is greatly enhanced by "aiming" the vertical portion 67 of the channel region 66 at the floating gate 26. In conventional programming schemes, the electrons in the channel region flow in a path parallel to the floating gate, where a relatively small number of the electrons become heated and injected onto the floating gate. The estimated program efficiency (number of electrons injected compared to total number of electrons) is estimated at about 1/1000. However, because the first portion of the channel region defines an electron path that is 'aimed' directly at the floating gate, the program efficiency of the present invention is estimated to be improved by one or more orders of magnitude, where almost all the electrons are injected onto the floating gate.

Also with the present invention, the control gate region formed against the side-wall of the second trenches 22 can be separately optimized for conduction performance as well as punch-through immunity without affecting cell size. The punch-through suppression between source region 16 and the buried bit-line region 32 can be optimized by embedding the source region having a first conductivity type (e.g. N type) in a well having a second conductivity type (e.g. P type) different from the first conductivity type, along with using other sub-surface implant(s) that do not affect the conduction characteristics of the memory cell. Furthermore, having source region 16 and bit-line region 32 separated vertically as well as horizontally allows easier optimization of reliability parameters without affecting cell size.

The L-shaped floating gate configuration of the present invention also provides for many advantages. Because the floating gate portions 26a/26b are made from a thin layer of poly material, the tips thereof are narrow and enhance Fowler-Nordheim tunneling to the control gate 40. There is no need for extensive thermal oxidation steps to form sharp edges for enhanced tunneling. There is also an enhanced voltage/capacitive coupling ratio between each floating gate 26 and the corresponding source region 16 given the proximity of the vertical floating gate portion 26b and the poly block 18 that is electrically connected to the source region 16 (separated only by thin oxide layer 24). At the same time, there is a relatively low voltage/capacitive coupling ratio between the floating gate 26 and the control gate poly 40, given the insulation provided by oxide spacer 30. Since the sharp tips of floating gate portions 26a/26b are not formed using an oxide process, the floating gate poly can be heavily doped, allowing the size of floating gate 26 to be scaled down further. Lastly, the overall memory cell size can be scaled down further given that there is no need to provide a vertical overlap of the floating gate 26 with the source region 16 for the desired program voltage/capacitive coupling therebetween.

First Alternate Embodiment

Figure 4A:
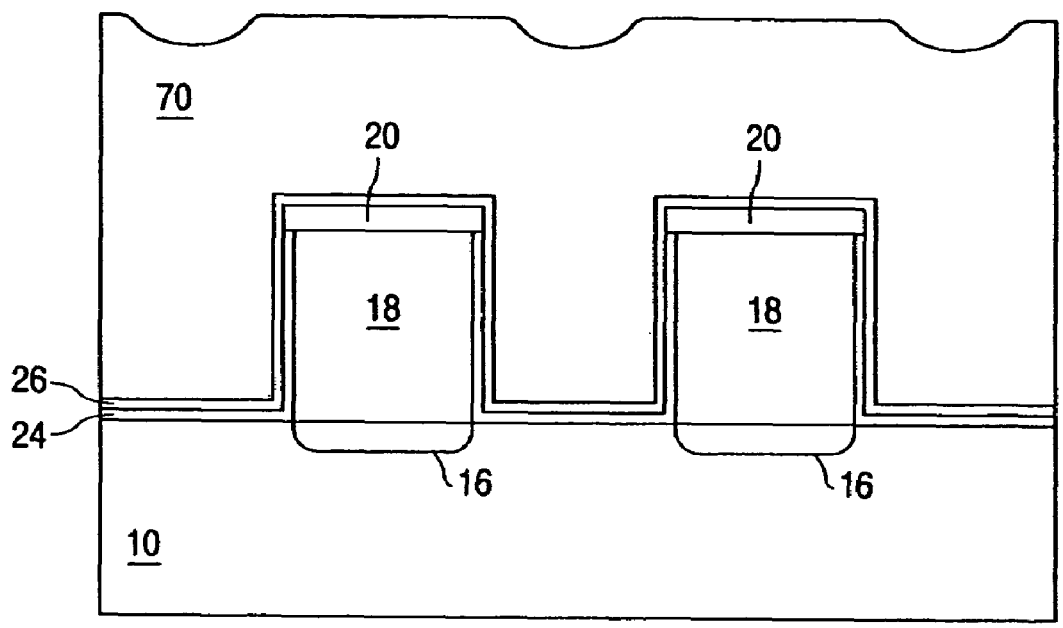
FIGS. 4A-4G are cross sectional views of a semiconductor structure showing in sequence the steps in a first alternate processing of the semiconductor structure of FIG. 1G in the formation of a non volatile memory array of floating gate memory cells of the present invention.

FIGS. 4A to 4G and 5A to 5E illustrate a first alternate process for forming the memory cell structure similar to that illustrated in FIG. 1M. This first alternate process begins with the same structure as shown in FIG. 1G, except that nitride 70 is deposited over the structure instead of oxide 28, as shown in FIG. 4A.

Figure 4B:
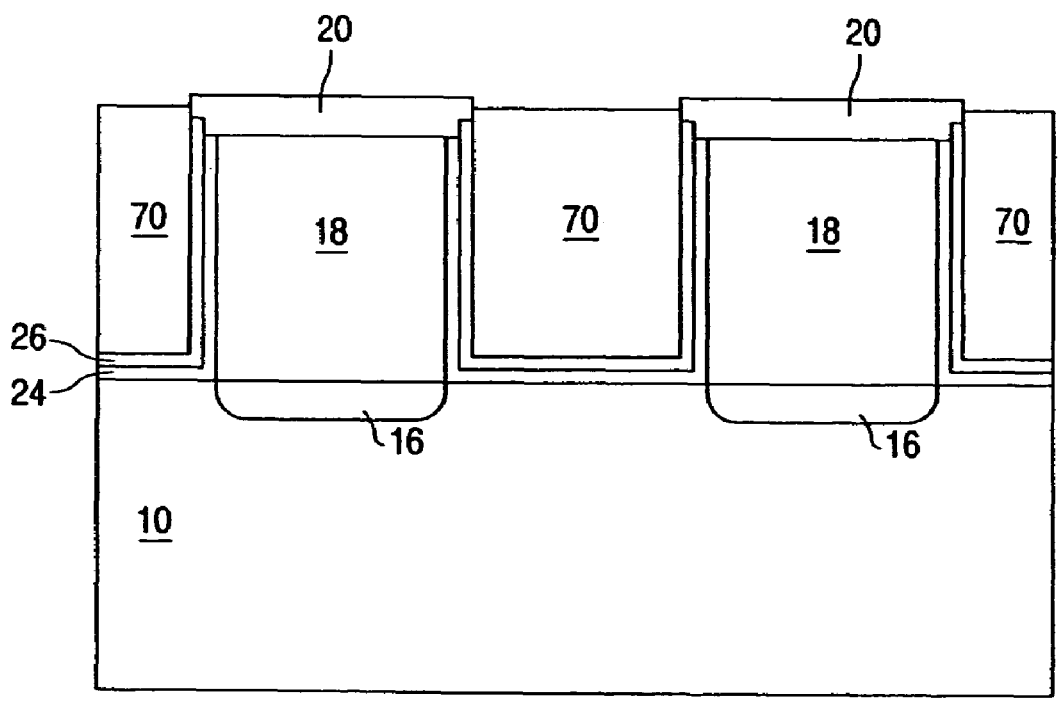

A planarizing nitride etch follows (e.g. CMP) that etches nitride 70 down even with the tops of poly layer 26 (using poly layer 26 as an etch stop), leaving exposed the portions of poly layer 26 disposed over oxide blocks 20. A thermal oxidation step is next, which oxides the exposed portions of poly layer 26, as shown in FIG. 4B. After nitride layer 70 is removed via a nitride etch, additional nitride is deposited over the structure, followed by an anisotropic nitride etch that removes all the nitride except for nitride spacers 72 along sidewalls of second trenches 22. The resulting structure is shown in FIG. 4C.

Figure 4C:
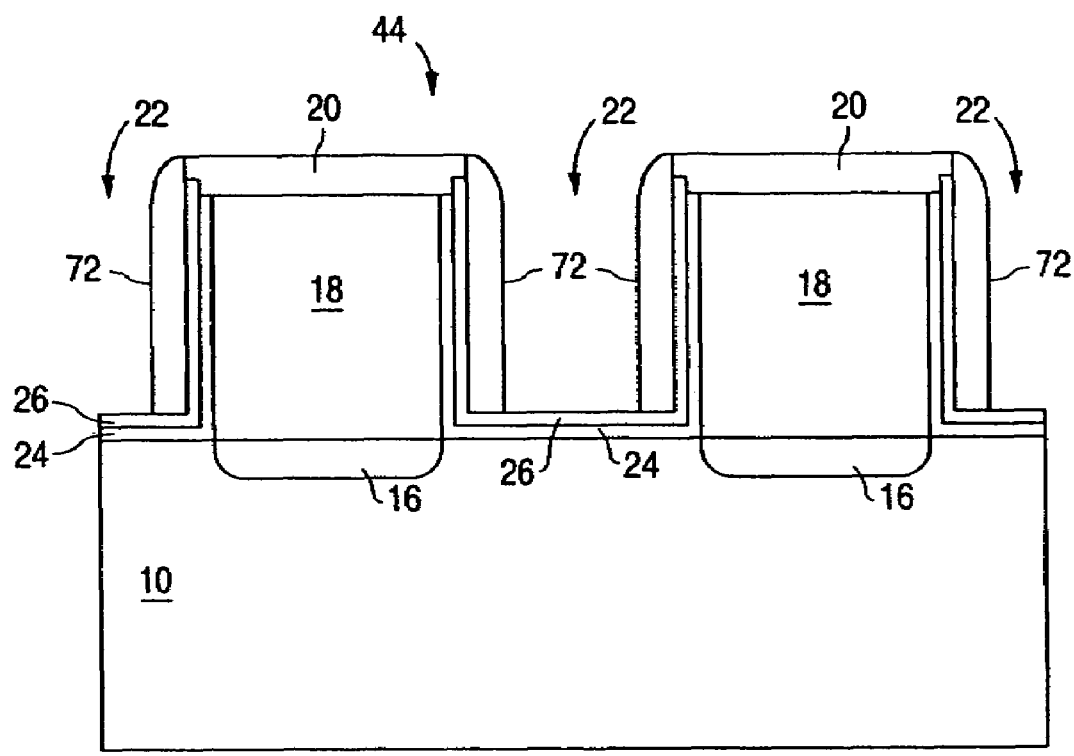
Figure 5A:
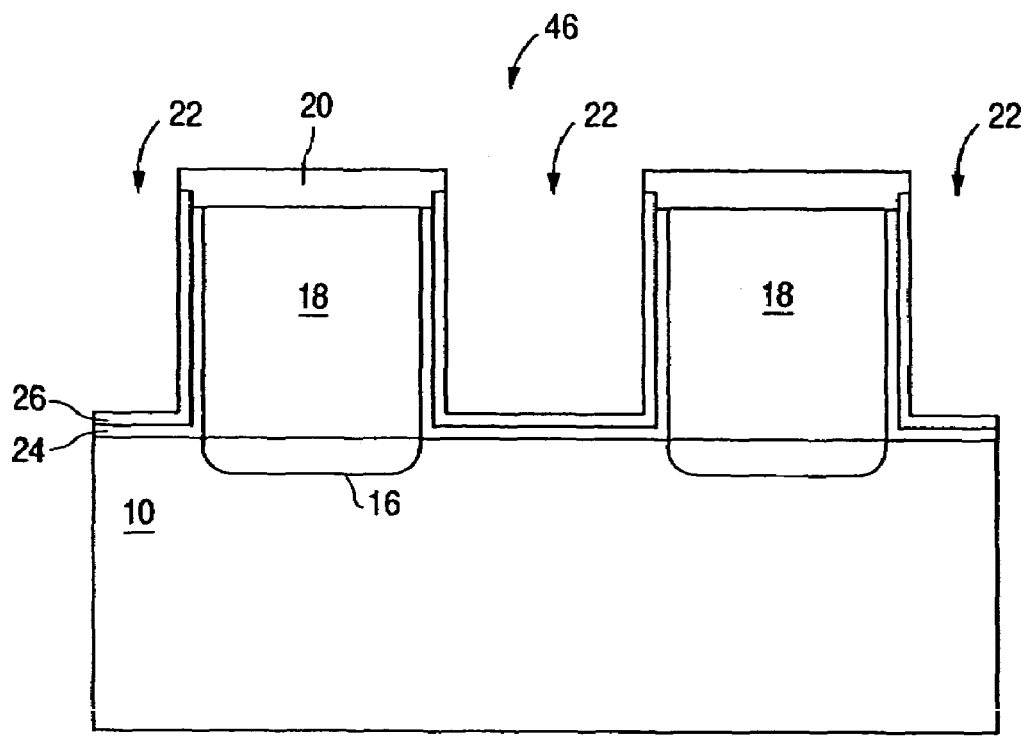
FIGS. 5A-5E are cross sectional views of a semiconductor structure showing in sequence the steps of processing the isolation regions with the first alternate processing shown in FIGS. 4A-4G.

Thus far, the structure shown in FIG. 4C is formed with one masking step, with second trenches 22 extending in one direction. At this point, the active and inactive regions are formed as follows. A photo resist material is applied to the structure shown in FIG. 4C, and a masking step is performed to selectively remove the photo resist material from parallel stripe regions. This masking step defines alternating parallel active regions 44 covered by the photo resist (in which active memory cells are formed) and inactive isolation regions 46 not covered by the photo resist (in which no active memory cells are formed). A nitride etch follows, which removes nitride spacers 72 from the isolation regions 46 (as shown in FIG. 5A), but not from the active regions 44 (which are protected by the photo resist material). The photo resist material is then removed, with the resulting active region structure shown in FIG. 4C and the resulting inactive isolation regions 46 shown in FIG. 5A.

Figure 4D:
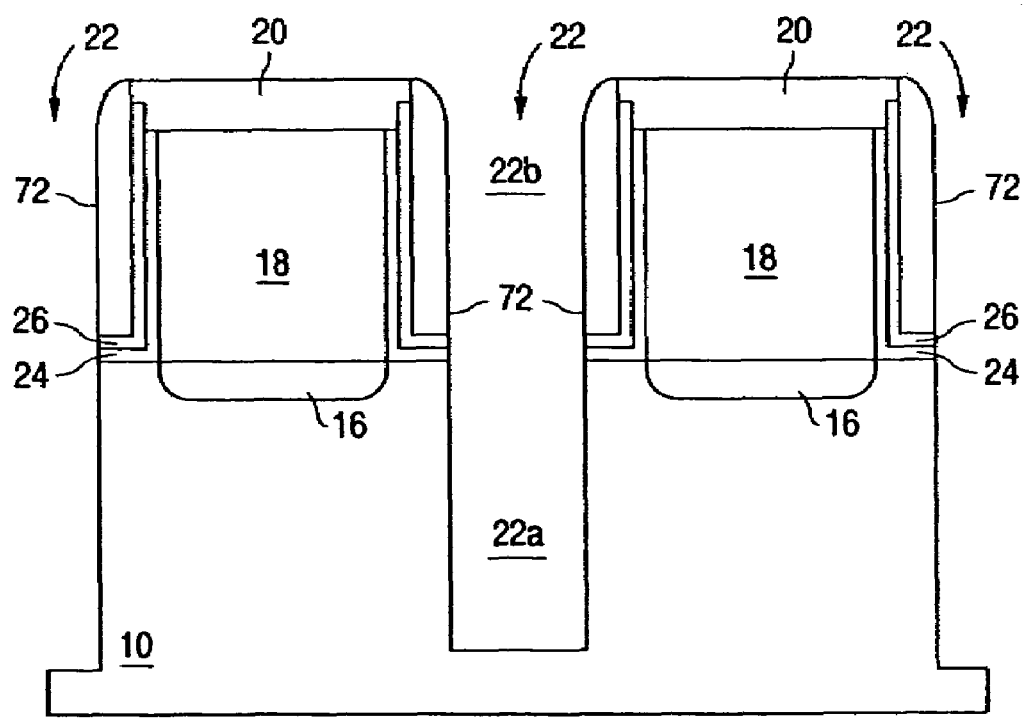
Figure 5B:
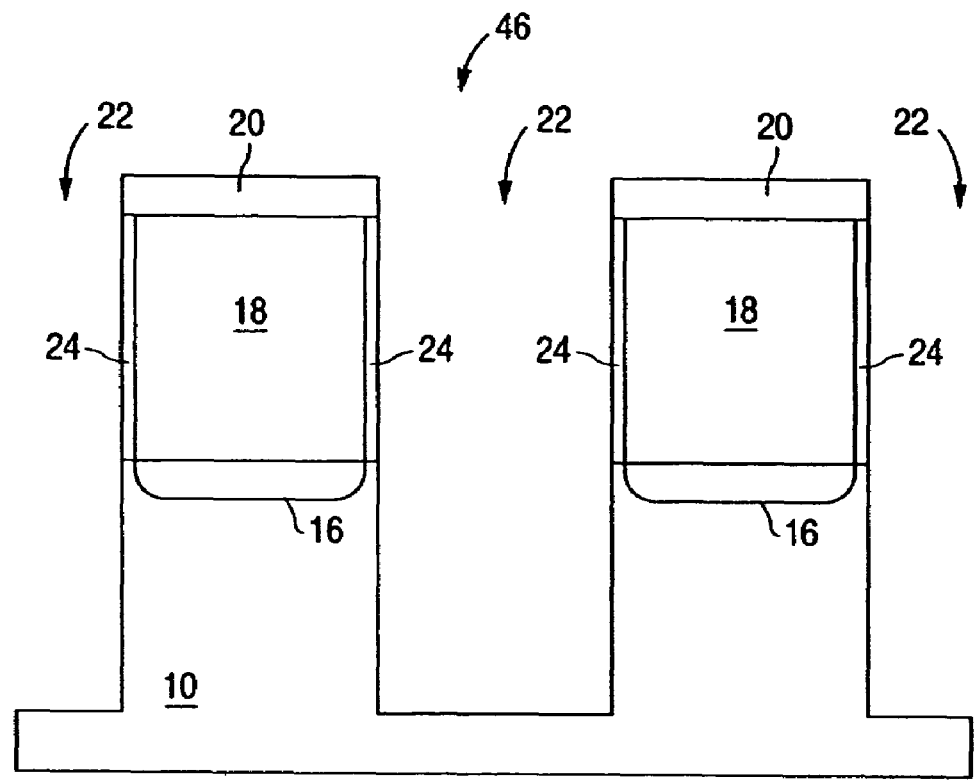

Next, an anisotropic poly etch and a controlled anisotropic oxide etch are then performed to remove the exposed portions of poly layer 26 and oxide layer 24 at the bottom of second trenches 22 (i.e. between spacers 72) in the active regions 44, leaving portions of substrate 10 exposed. A small portion of oxide layer 20 is also consumed by this oxide etch. A silicon etch process is then used to remove portions of substrate 10 left exposed at the bottom of second trenches 22 and in-between nitride spacers 72. This etch process extends second trenches 22 down into the substrate 10 (e.g. down to a depth of approximately one feature size deep, e.g. about 0.11 um deep with 0.11 um technology), where lower portions 22a of second trenches 22 formed in substrate 10 have a width corresponding to the separation of nitride spacers 72 in upper portions 22b of second trenches 22. The resulting active region structure is shown in FIG. 4D. In the inactive regions 46, the above described poly and oxide etches remove the poly layer 26 in its entirety, as well as oxide layer 24 at the bottom of second trenches 22. The silicon etch then extends second trenches 22 into the substrate, as shown in FIG. 5B.

Figure 4E:
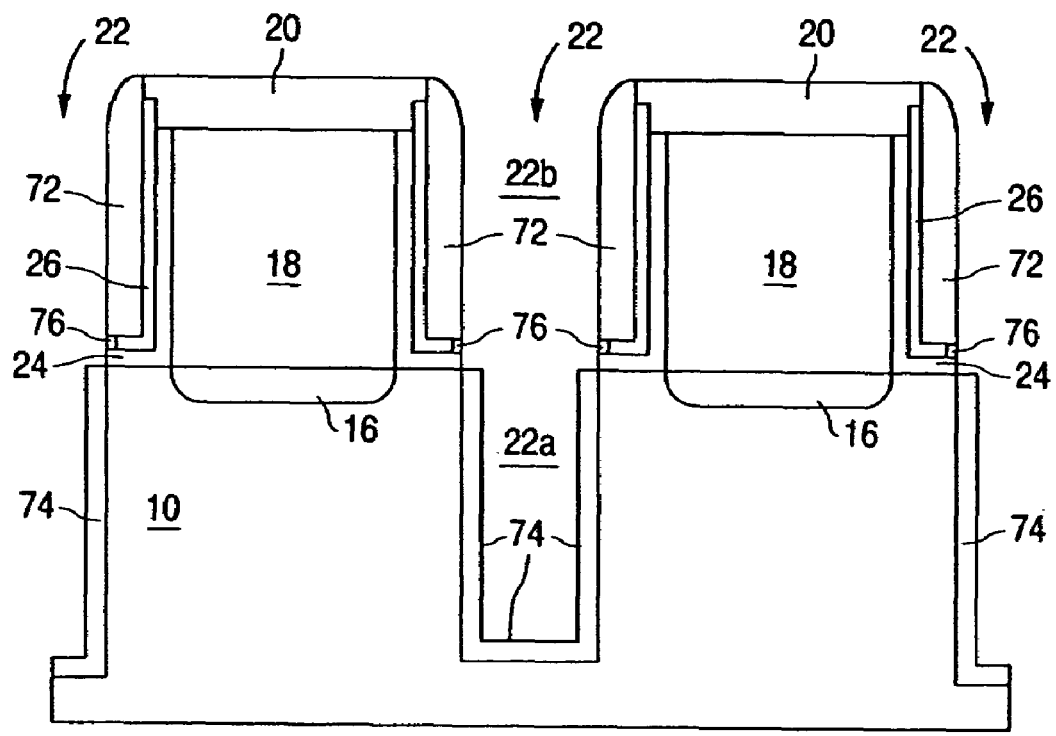
Figure 4F:
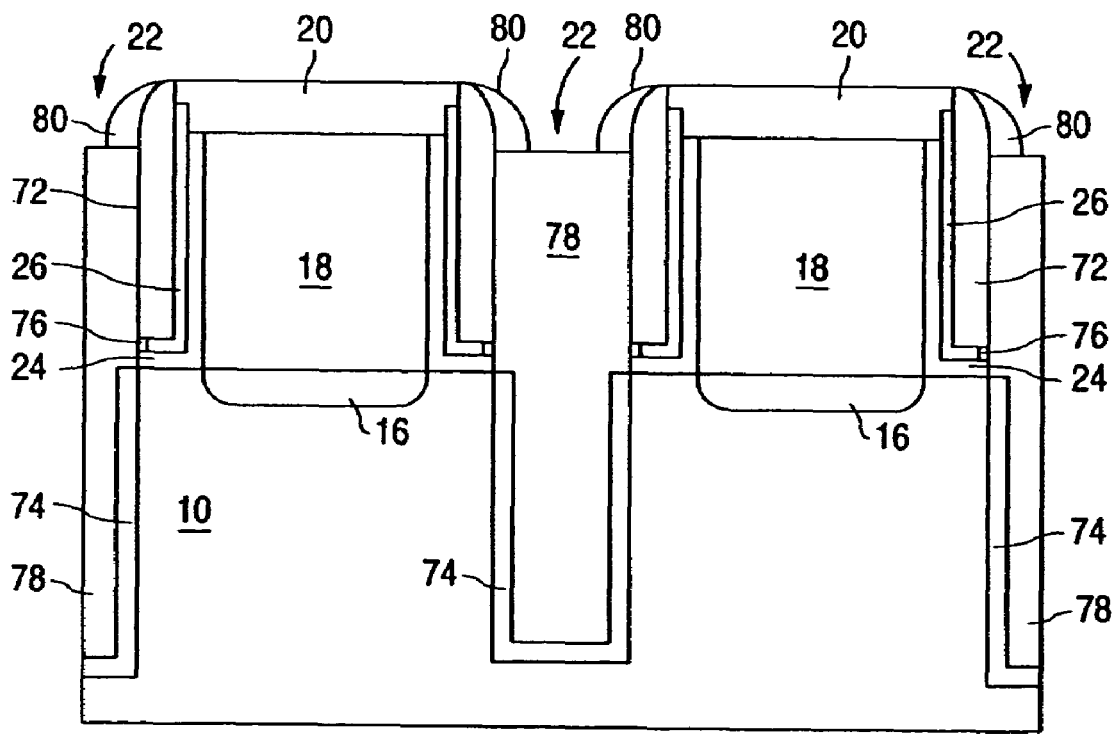
Figure 5C:
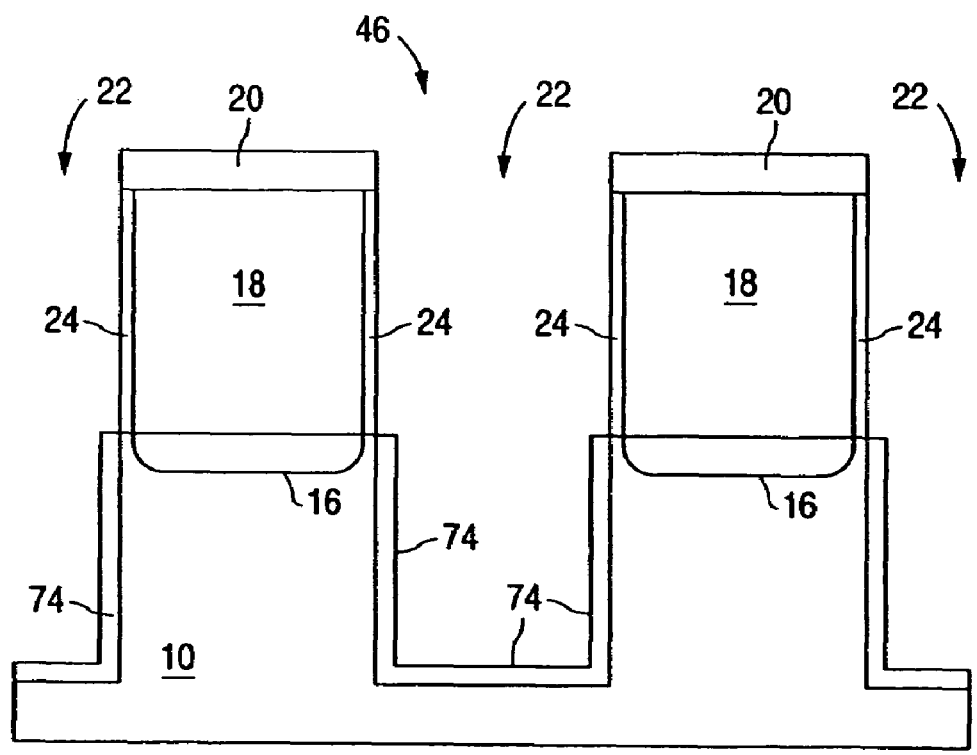
Figure 5D:
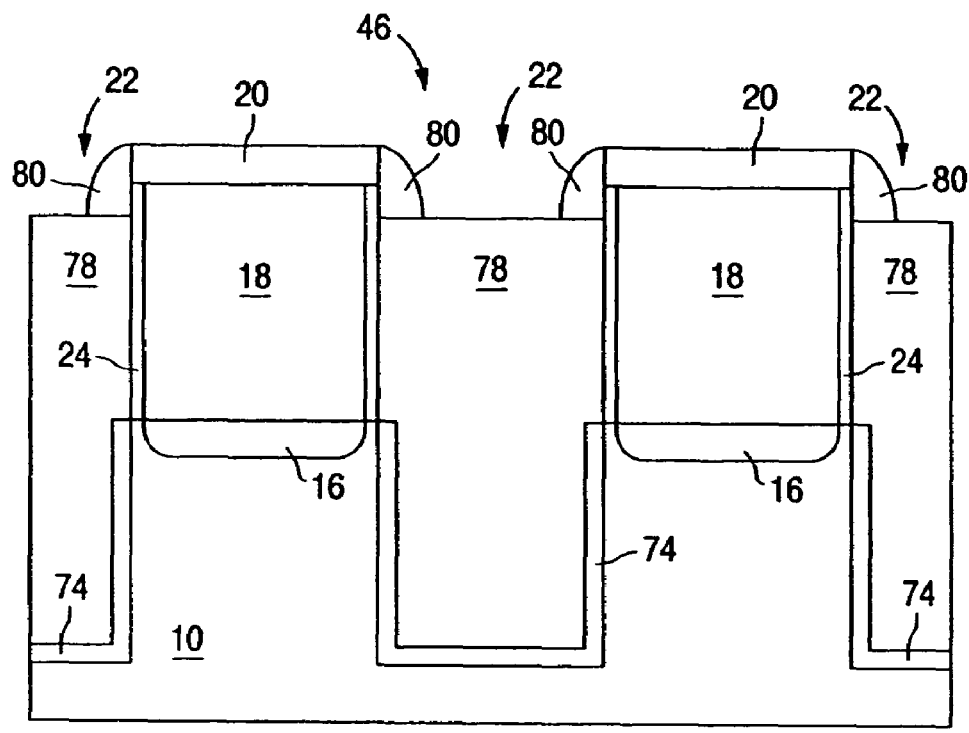

A thermal oxidation process is next, which forms an oxide layer 74 on the exposed substrate sidewalls of the second trenches 22 in both the active and inactive regions 44/46, and an oxide layer 76 on the exposed ends of poly layer 26 in the active regions 44 (which tends to sharpen these poly layer ends), as shown in FIGS. 4E and 5C. As described later, oxide layer 76 has a thickness that permits Fowler-Nordheim tunneling therethrough. A thick poly layer is next deposited over the active and inactive region structures, filling second trenches 22. An anisotropic poly etch follows that removes the deposited poly layer except for poly blocks 78 inside trenches 22 (e.g. CMP poly etch using oxide blocks 20 as an etch stop). A timed poly etch is then used to recess the poly blocks 78 below oxide blocks 20. Poly blocks 78 can be doped by ion implant, or by in-situ process. Nitride is then deposited over the structure, followed by an anisotropic nitride etch that removes the deposited nitride except for nitride spacers 80 that are formed over poly blocks 78 and against the upper portion of second trench sidewalls, leaving a portion of poly blocks 78 exposed. The resulting active region structure is shown in FIG. 4F, and the resulting inactive region structure is shown in FIG. 5D.

Figure 4G:
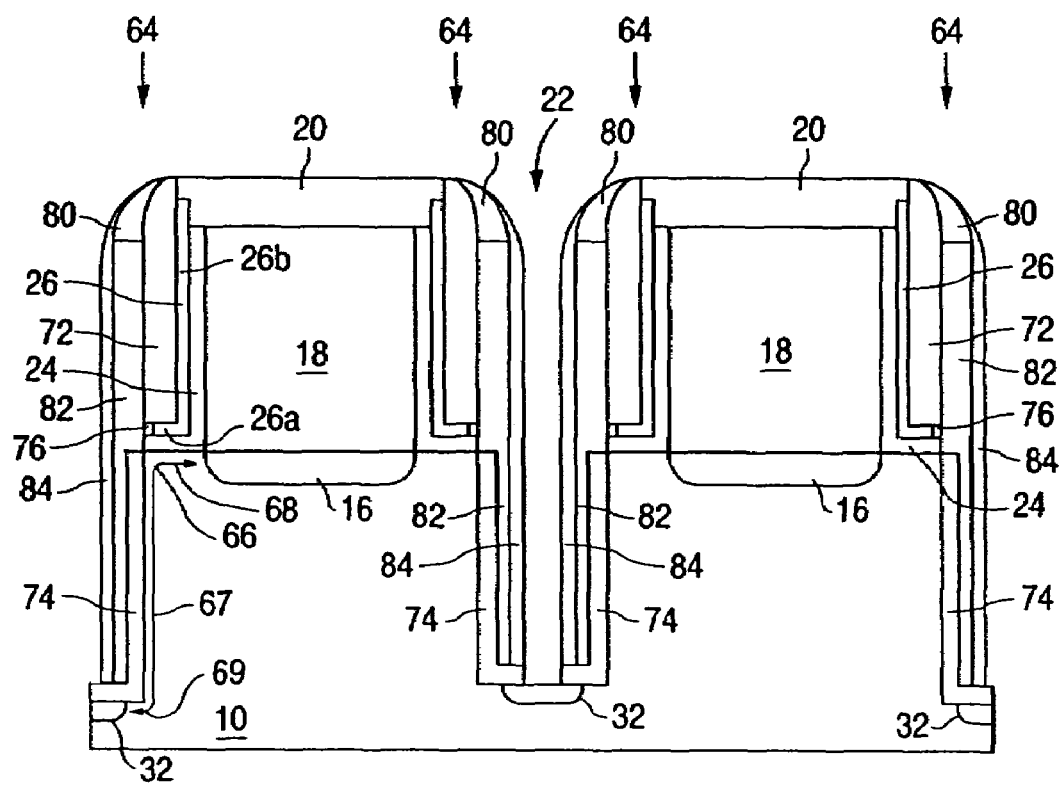
Figure 5E:
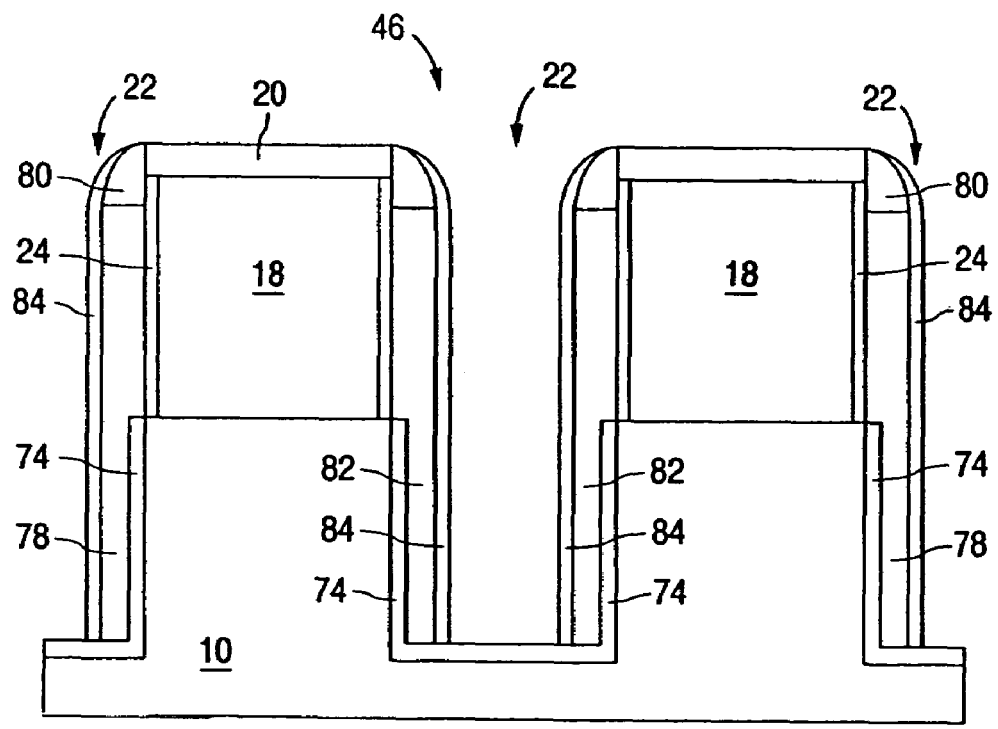

An anisotropic poly etch is then used to remove the exposed portions of poly bocks 78 (between spacers 80), as illustrated in FIGS. 4G and 5E. This poly etch extends second trenches 22 through poly block 78 down to oxide layer 74, leaving a pair of opposing poly layers 82 in each of the second trenches 22. With the isolation regions protected by a masking material, ion implantation is then performed to form the second (drain) regions 32 in the substrate underneath second trenches 22 and between poly layers 82, in the active regions only After the masking material is removed, oxide spacers 84 are then formed along the sidewalls of second trenches 22 by oxide deposition and anisotropic etch, which leaves the drain portions 32 of substrate 10 exposed at the bottom of the second trenches 22. The resulting active and inactive region structures are shown in FIGS. 4G and 5E.

Well known back end processing is then performed to finish the memory array, including forming insulation material over the structure, and forming metal electrical contacts that extend through the insulation material and make electrical contact with the drain regions 32.

FIG. 4G illustrates the final structure of the memory cells 64 formed in the active regions 44, which is the same configuration as the embodiment shown FIG. 1M except for a few significant differences. While L-shaped poly layer 26 constitutes the floating gate, poly layer 82 constitutes the control gate for each of the memory cells. Control gates 82 are formed as continuously formed control lines that extend in the row direction across the isolation and active regions 46/44, where each control line connects together all the control gates in that row of memory cells (one from each active region). Each floating gate 26 is formed of an L-shaped thin layer of polysilicon that includes a pair of orthogonally oriented elongated portions 26a/26b joined at their proximal ends. Floating gate portion 26a extends substantially parallel to and insulated from the substrate surface (for turning on channel region portion 68). Floating gate portion 26b extends substantially parallel to and insulated from the vertical surface of poly block 18 (for strong voltage/capacitive coupling therebetween). Floating gate portion 26a has a distal end that terminates in a thin tip portion that directly faces and is insulated from the adjacent control gate 82 (for Fowler-Nordheim tunneling therebetween through oxide layer 76). Insulation spacer 72 reduces the voltage/capacitive coupling between the floating gate 26 and control gate 82. Drain region 32 can be narrower than the width of the second trench 22, causing channel region 66 to have a second horizontal portion 69 underneath second trench 22, and between drain region 32 and channel region vertical portion 67. Lastly, the second trenches 22 can be filled with a metal contact, with a bit line connecting together all the drain contacts in each of the active regions.

Second Alternate Embodiment

FIGS. 6A to 6D illustrate a second alternate process for forming the memory cell structure similar to that shown in FIG. 1M, except that the control gate does not extend into the substrate and the channel regions are linear. This second alternate process begins with the same structure as shown in FIG. 1D (re-shown as FIG. 6A).

Figure 6A:
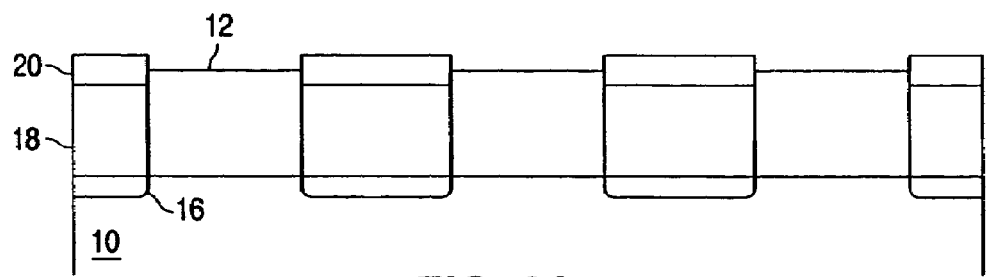
FIGS. 6A-6D are cross sectional views of a semiconductor structure showing in sequence the steps in a second alternate processing of the semiconductor structure of FIG. 1D in the formation of a non volatile memory array of floating gate memory cells of the present invention.
Figure 6B:
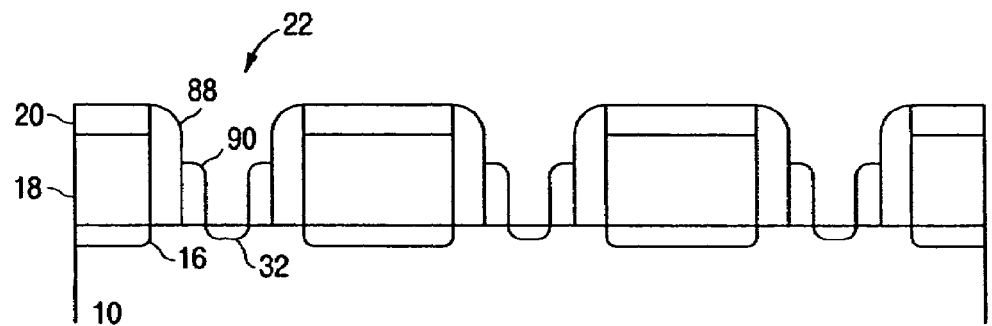

A nitride etch is used to remove the nitride blocks 12 and form second trenches 22 between the poly blocks 18. Nitride spacers 88 are then formed along the sidewalls of the second trenches 22 using a nitride deposition and anisotropic etch back process. Another nitride deposition and anisotropic etch back process is used to form nitride spacers 90 along nitride spacers 88. Suitable ion implantation is then used to form the second (drain) regions 32 in the exposed substrate at the bottom of second trenches 22 and between nitride spacers 90. The resulting structure is shown in FIG. 6B.

Figure 6C:
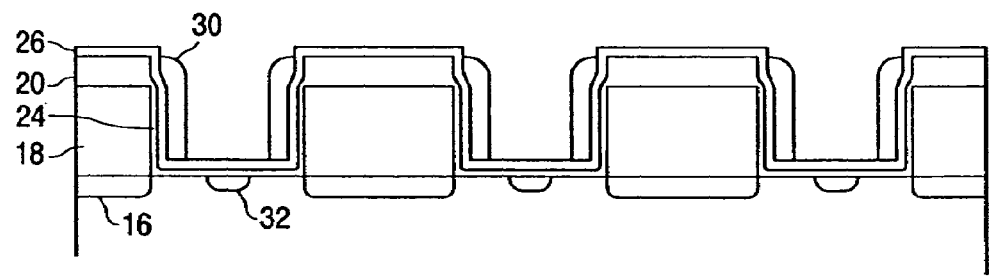

A nitride etch is next used to remove nitride spacers 88/90 from second trenches 22. A thermal oxidation process follows to form the thin layer of oxide 24 on exposed surfaces of poly blocks 18 and substrate 10 (inside second trenches 22). Next, the thin poly layer 26 is formed over the structure, the thickness of which (e.g. 30-500 Å thick) dictates the eventual thickness of the floating gates for the final memory cell device. The insulating spacers 30 are then formed along the side walls of second trenches 22 via an oxide deposition and anisotropic etch process. The resulting structure is shown in FIG. 6C.

A poly etch is then performed to remove the exposed portions of poly layer 26 (i.e. those portions not protected by oxide spacers 30). A controlled oxide etch and (thermal) oxidation process is performed to remove and re-form (as layer 24a) the exposed portions of oxide layer 24 at the bottom of second trenches 22 with the desired thickness. This oxide etch and oxidation process also forms oxide layer 36 on the exposed ends of poly layer 26 (which tends to sharpen these poly layer ends). The thick poly layer 40 is deposited over the structure, filling second trenches 22, and resulting in the structure shown in FIG. 6D.

Figure 6D:
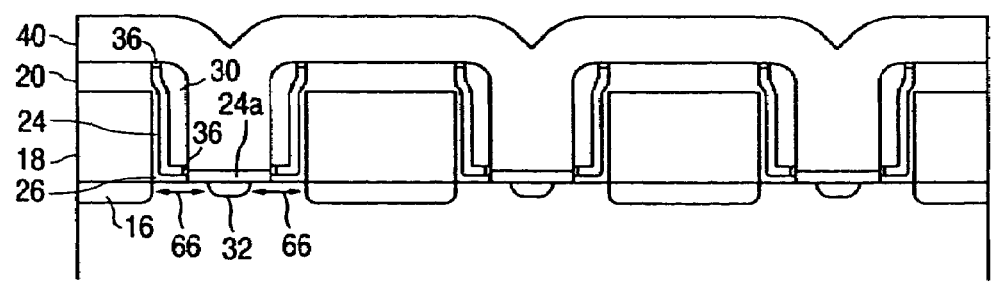

The masking and etch steps as described above with respect to FIGS. 1L-1N are next performed to form the isolation and active regions for the structure in FIG. 6D and complete the formation of the array of memory cells. Like the first embodiment, the structure in FIG. 6D has L-shaped floating gates 26 each having a pair of ends directly facing the control gate 40 (for providing two separate lines for Fowler-Nordheim tunneling to the control gate 40). Unlike the first embodiment, the control gates 40 for the structure in FIG. 6D do not extend into the substrate, and the channel regions are linear (each having a first portion controlled by the floating gate and a second portion controlled by the control gate 40).

Third Alternate Embodiment

Figure 7A:
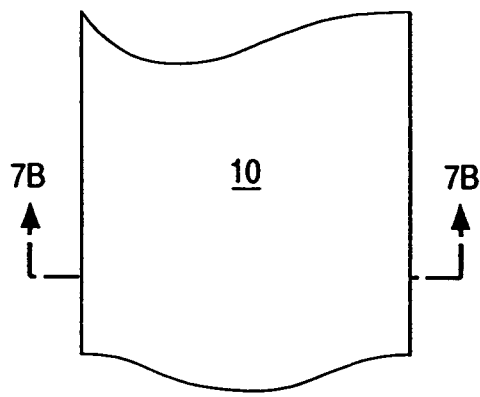
FIGS. 7A-7F are cross sectional views of a semiconductor structure showing in sequence the steps of forming isolation regions for a third alternate processing of a semiconductor structure in the formation of a non volatile memory array of floating gate memory cells of the present invention.
Figure 7B:
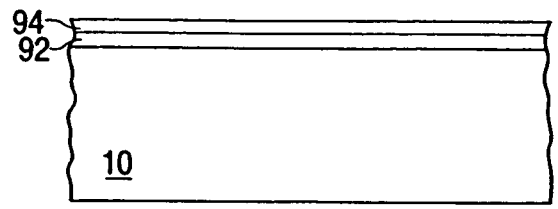

FIGS. 7A to 7E, 8A to 8E and 9A to 9C illustrate a third alternate process for forming the memory cell structure of the present invention, where the isolation regions are formed first, and the control gates are formed above the substrate surface and continuously extend in the row direction across the isolation and active regions. This third alternate process begins by performing the well known STI (shallow trench isolation) method of forming isolation regions on a substrate. Referring to FIG. 7A there is shown a top plan view of the semiconductor substrate 10 (or a semiconductor well), which is preferably of P type. First and second layers of material 92 and 94 are formed (e.g. grown or deposited) on the substrate. For example, first layer 92 can be oxide formed by oxidation or oxide deposition (e.g. CVD) to a thickness of approximately 50-150 Å. Nitrogen doped oxide or other insulation dielectrics can also be used. Second layer 94 can be nitride, which is formed over oxide layer 92 preferably by CVD or PECVD to a thickness of approximately 1000-5000 Å. FIG. 7B illustrates a cross-section of the resulting structure.

Figure 7D:
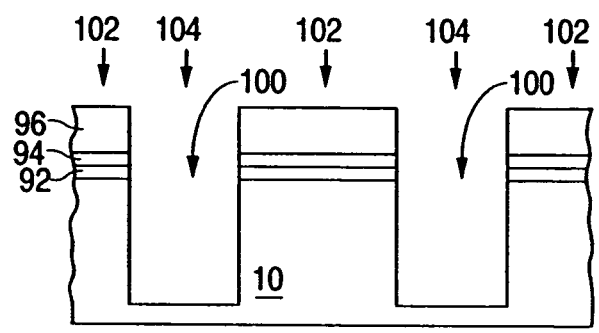
Figure 7C:
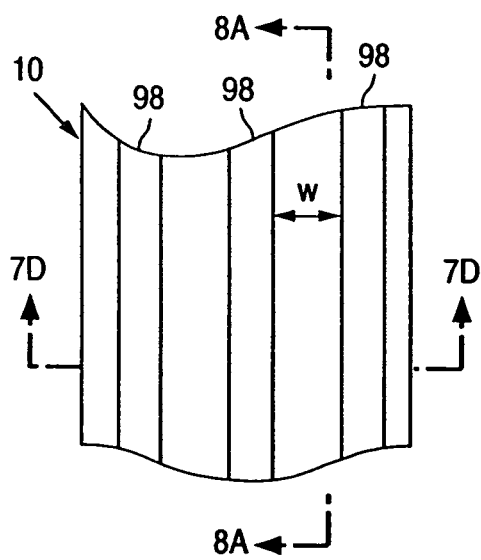

Once the first and second layers 92/94 have been formed, suitable photo resist material 96 is applied on the nitride layer 94 and a masking step is performed to selectively remove the photo resist material from certain regions (stripes 98) that extend in the Y or column direction, as shown in FIG. 7C. Where the photo-resist material 96 is removed, the exposed nitride layer 94 and oxide layer 92 are etched away in stripes 98 using standard etching techniques (i.e. anisotropic nitride and oxide/dielectric etch processes) to form isolation trenches 100 in the structure. The distance W between adjacent stripes 98 can be as small as the smallest lithographic feature of the process used. A silicon etch process is then used to extend isolation trenches 100 down into the silicon substrate 10 (e.g. to a depth of approximately 500 Å), as shown in FIG. 7D. Where the photo resist 96 is not removed, the nitride layer 94 and oxide layer 92 are maintained. The resulting structure illustrated in FIG. 7D now defines active regions 102 interlaced with isolation regions 104.

Figure 7E:
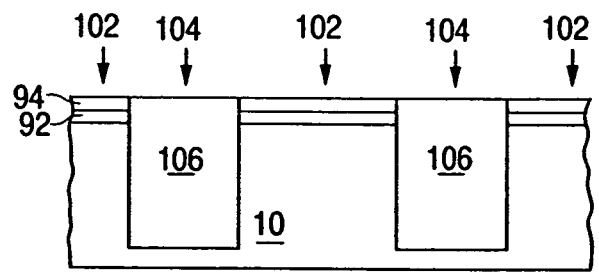

The structure is further processed to remove the remaining photo resist 96. Then, an isolation material such as silicon dioxide is formed in isolation trenches 100 by depositing a thick oxide layer, followed by a CMP oxide etch (using nitride layer 94 as an etch stop) to remove the oxide layer except for oxide blocks 106 in isolation trenches 100, as shown in FIG. 7E. The remaining nitride and oxide layers 94/92 are then removed using nitride/oxide etch processes, leaving STI oxide blocks 106 extending along isolation regions 104, as shown in FIG. 7F.

The STI isolation method described above is the preferred method of forming isolation regions 104. However, the well known LOCOS isolation method (e.g. recessed LOCOS, poly buffered LOCOS, etc.) could alternately be used, where the isolation trenches 100 may not extend into the substrate, and isolation material may be formed on the substrate surface in stripe regions 98. FIGS. 7A to 7F illustrate the memory cell array region of the substrate, in which columns of memory cells will be formed in the active regions 102 which are separated by the isolation regions 104.

Figure 7F:
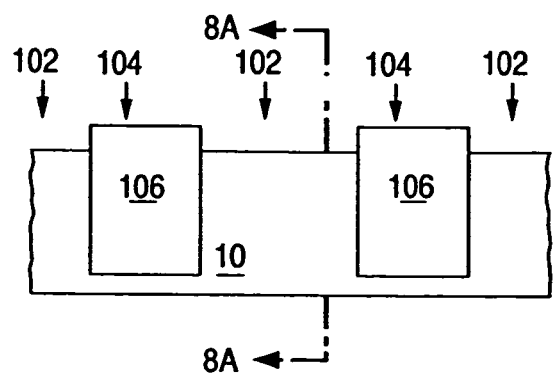
Figure 8A:
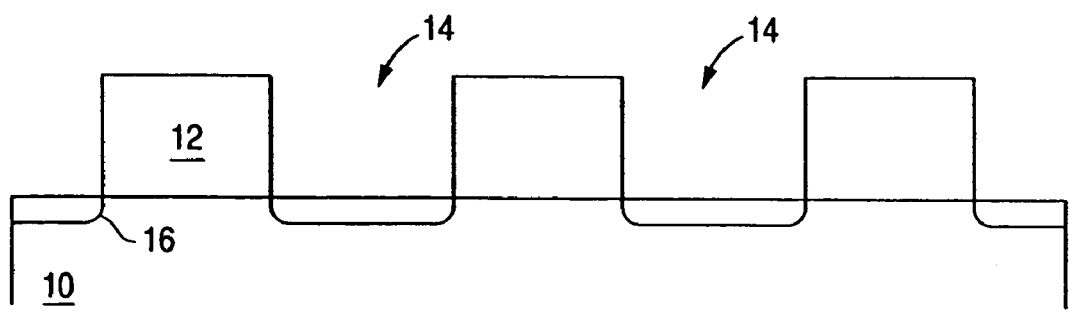
FIGS. 8A to 8E are cross sectional views of a semiconductor structure showing in sequence the steps in the third alternate processing embodiment of the semiconductor structure shown in FIG. 7F.

The structure shown in FIG. 7F is further processed as follows. FIGS. 8A to 8E show the cross sections of the structure in the active regions 102 from a view orthogonal to that of FIG. 7F (along line 8A-8A as shown in FIGS. 7C and 7F), as the next steps in the process of the present invention are performed. As shown in FIG. 8A, nitride blocks 12 and first trenches 14 therebetween are formed in the same manner as described above with respect to FIG. 1A. Suitable ion implantation is then made across the surface of the structure to form first (source) regions 16 in the exposed substrate portions at the bottom of first trenches 14 in the active regions. The ion implantation has no effect on the STI oxide blocks -106, and therefore each source region 16 is confined to one active region 102. The resulting active region structure is shown in FIG. 8A.

Figure 8B:
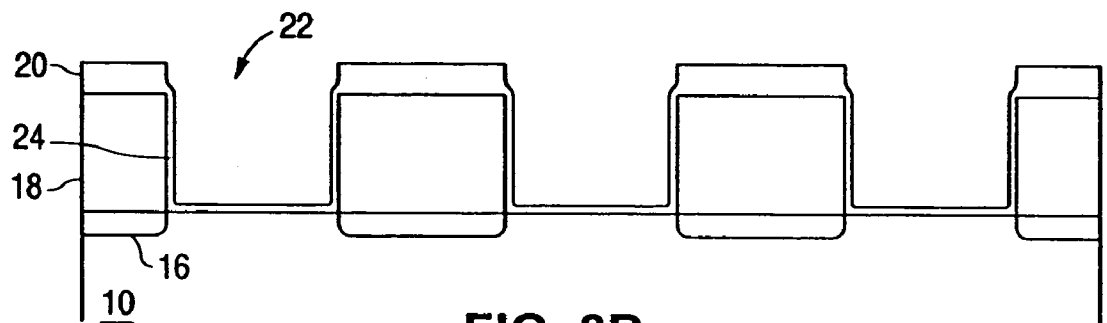

Both the active and isolation regions 102/104 of the first trenches 14 are filled with poly blocks 18 via a poly deposition and planarization etch process (e.g. CMP). Thermal oxidation is then used to form oxide layer 20 on the exposed top surfaces of poly blocks 18. A nitride etch process follows to remove nitride blocks 12, leaving second trenches 22 defined between the poly blocks 18 and extending across both the active and isolation regions 102/104. A thermal oxidation process follows to form a thin layer of oxide 24 on exposed surfaces of poly blocks 18 and substrate 10 (inside second trenches 22). The resulting structure is shown in FIG. 8B.

Figure 8C:
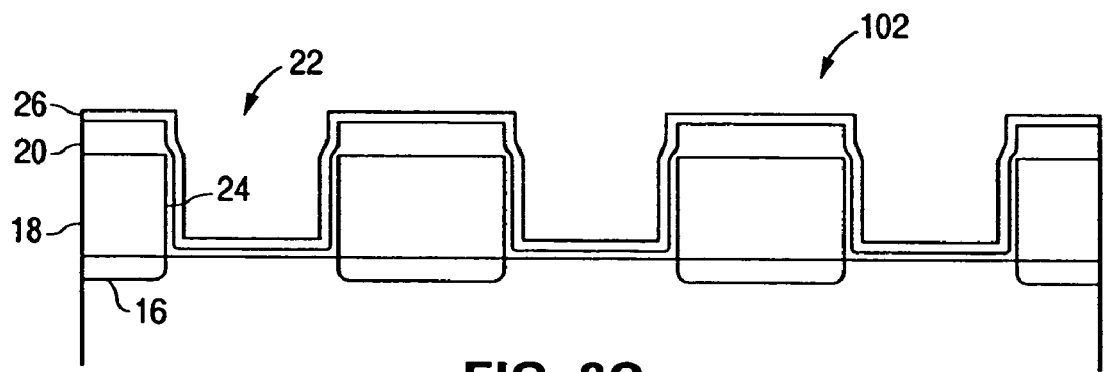
Figure 9A:
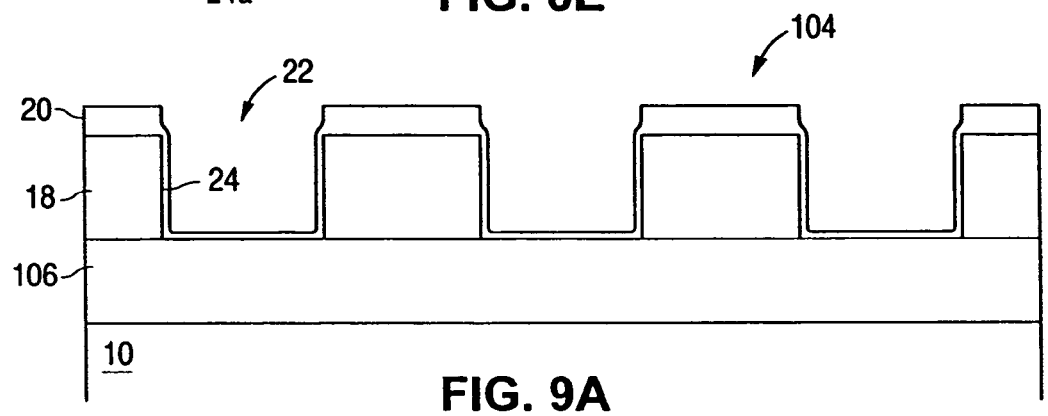
FIGS. 9A-9C are cross sectional views of an isolation region of the semiconductor structure showing in sequence the steps in the third alternate processing embodiment.

Next, thin poly layer 26 is formed over the structure in both the active and isolation regions 102/104. A masking step is then performed to form masking material over the active regions 102, while leaving isolation regions 104 exposed. Then, a poly etch process is used to remove the exposed poly layer 26 from the isolation regions. After the masking material is removed, the active region structure is shown in FIG. 8C, and the isolation region structure is shown in FIG. 9A.

Figure 8D:
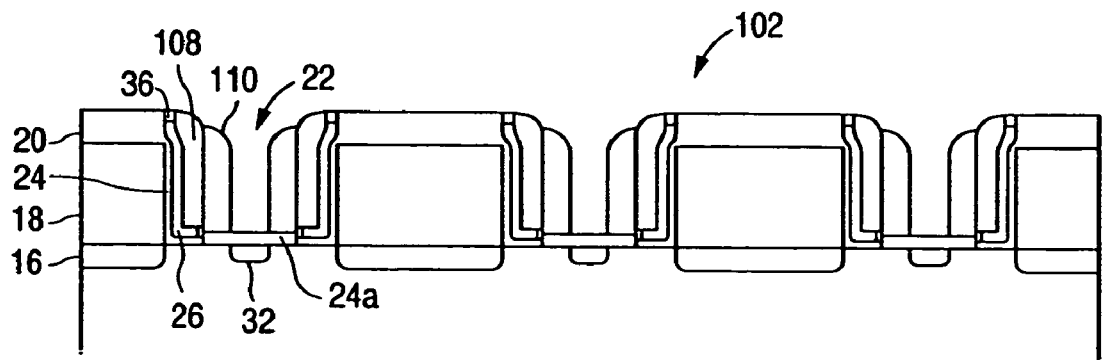
Figure 9B:
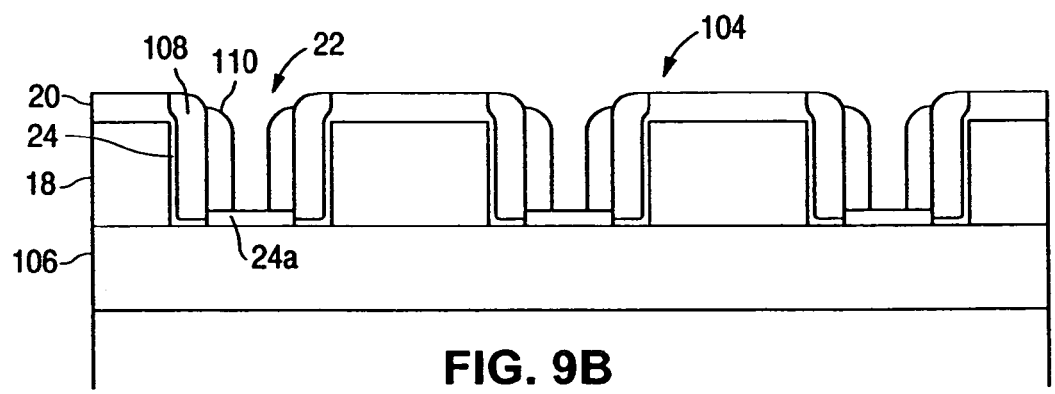

Oxide spacers 108 are formed along sidewalls of the second trenches 22 in both the active and isolation regions 102/104. A poly etch is then performed to remove the exposed portions of poly layer 26 from the active regions 102 (i.e. those portions not protected by oxide spacers 108). A controlled oxide etch and (thermal) oxidation process is performed to remove and reform (as layer 24a) the exposed portions of oxide layer 24 at the bottom of second trenches 22 with the desired thickness. This oxide etch and oxidation process also forms the oxide layer 36 on the exposed ends of poly layer 26 (in the active regions 102). Poly spacers 110 are formed along oxide spacers 108 via a poly deposition and anisotropic etch back process. Suitable ion implantation is once again made across the entire surface of the structure to form second (drain) regions 32 in the active regions 102 of substrate 10 (between poly spacers 110). This ion implant has no effect in the inactive regions. The resulting active and isolation region structures are shown in FIGS. 8D and 9B.

Figure 8E:
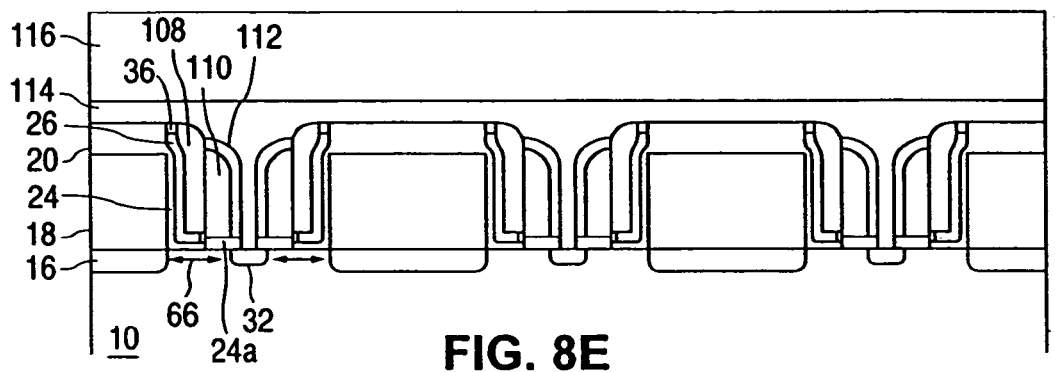
Figure 9C:
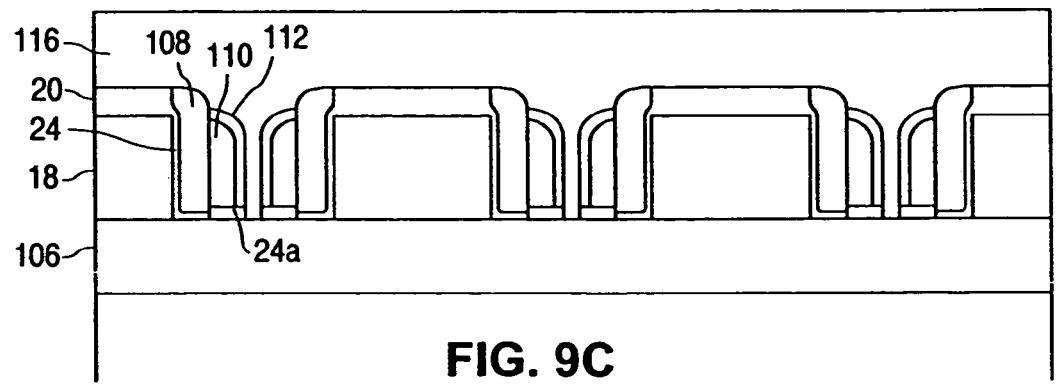

An oxide deposition and anisotropic etch process is next used to form oxide spacers 112 along poly spacers 110, and to etch away a portion of oxide layer 24a to expose the substrate (and the drain regions 32 thereof) in the active regions 102 and at the center of second trenches 22. A conductive metal 114 is deposited over the active and isolation regions 102/104, filling second trenches 22 with metal that makes electrical contact with the drain regions 32 (in the active regions 102). A metal masking process is then used to remove metal 114 from the isolation regions 104 (by forming masking material over just the active regions 102 and performing a metal etch). Passivation 116 is then formed over the entire structure. The resulting active and isolation regions 102/104 are shown in FIGS. 8E and 9C, respectively.

In this embodiment, poly spacer 110 constitutes the control gate for each memory cell, and each poly spacer 110 continuously extends across the active and isolation regions 102/104 to form a control line for applying a voltage to each memory cell in that row of the memory cell array. In addition, the channel region 66 is linear, having a first portion controlled by the floating gate 26 and a second portion controlled by the control gate 110. Lastly, for each active region 102, the metal layer 114 electrically connects together all the drain regions 32 disposed therein.

Fourth Alternate Embodiment

FIGS. 10A to 10F illustrate a fourth alternate method for making the memory cell array of the present invention, which combines a buried L-shaped floating gate with a buried source and a control gate spacer. This fourth alternate process begins with the structure shown in FIG. 7F. The active region portions of the substrate 10 can be doped at this time for better independent control of the cell array portion of the memory device relative to any supporting periphery regions that incorporate supporting operating devices. Such doping is often referred to as a $V_t$ implant or cell well implant, and is well known in the art. During this implant, any periphery regions are protected by a photo resist layer, which is deposited over the entire structure and removed from just the memory cell array region of the substrate.

Figure 10A:
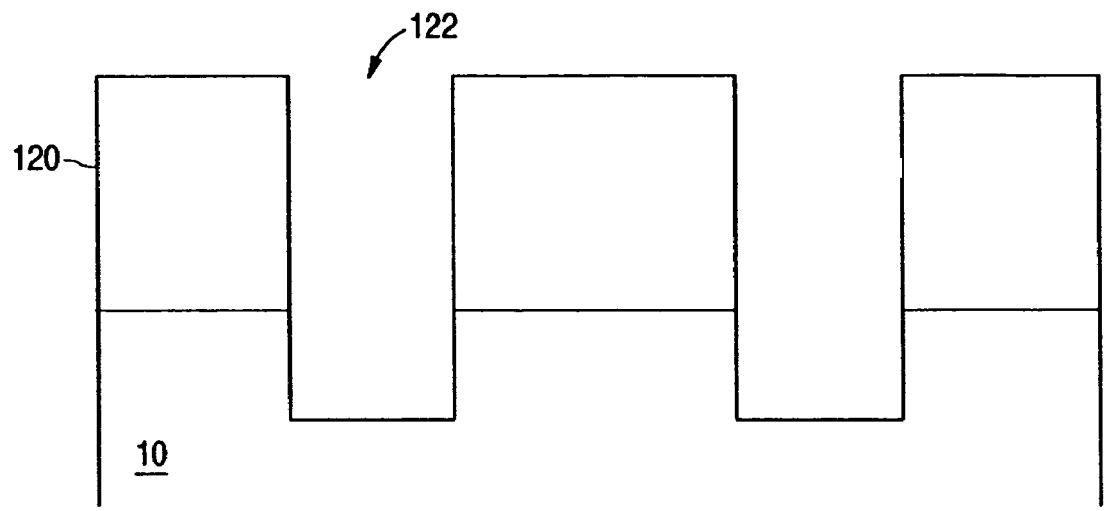
FIGS. 10A to 10F are cross sectional views of a semiconductor structure showing in sequence the steps in a fourth alternate processing embodiment of the semiconductor structure shown in FIG. 7F.

A thick layer of hard mask material 120 such as nitride is formed over the active and isolation regions 102/104 (e.g. ~3500 Å thick). A plurality of parallel trenches 122 are formed in the nitride layer 120 by applying a photo resist (masking) material on the nitride layer 120, and then performing a masking step to remove the photo resist material from selected parallel stripe regions. An anisotropic nitride etch is used to remove the exposed portions of nitride layer 120 in the stripe regions, leaving trenches 122 that extend down to and expose substrate 10 in the active regions 102 and the STI oxide blocks 106 in the isolation regions 104. After the photo resist is removed, a silicon anisotropic etch process is then used to extend trenches 122 down into the substrate 10 in each of the active regions 102 (for example, down to a depth of approximately 500 Å to several microns with 0.11 um technology). Alternately, the photo resist can be removed after trenches 122 are formed into the substrate 10. The resulting active region structure is shown in FIG. 10A. The silicon etch has no effect on the STI oxide blocks in the isolation regions 104.

Figure 10B:
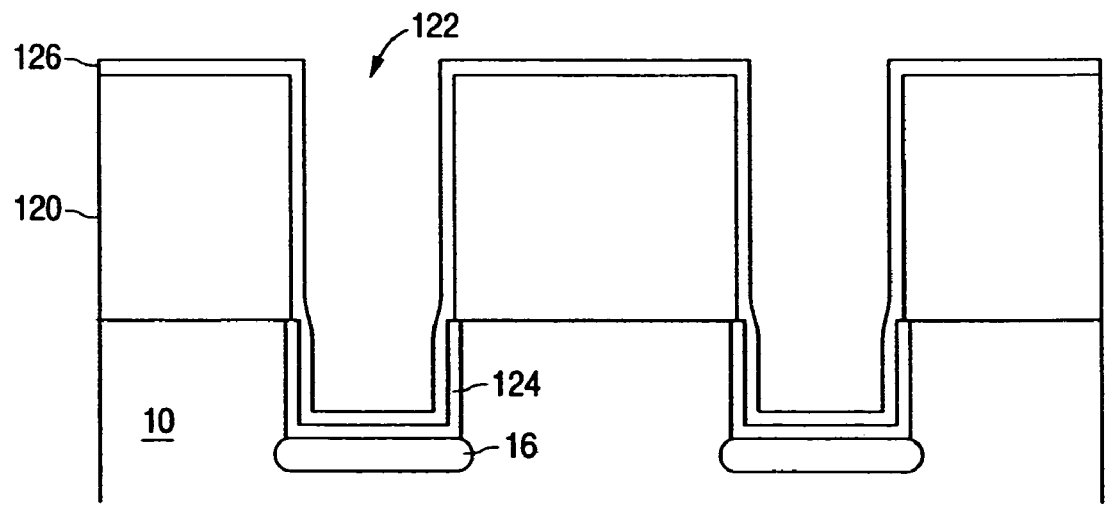

A layer of insulation material 124 is next formed (preferably using a thermal oxidation or CVD oxide process) along the exposed silicon in trenches 122 that forms the bottom and lower sidewalls of the trenches 122 (e.g. ~60 Å to 150 Å thick). Ion implantation (and possible anneal) process is used to form the first (source) regions 16 in the active region substrate portions at the bottom of trenches 122 (the isolation regions 104 are unaffected by the ion implantation). A thin poly layer 126 is then formed over the structure, which can be doped (e.g. n+) by ion implant, or by an in-situ process. The thickness of poly layer 126 is preferably 30-500 Å, and dictates the eventual thickness of the floating gates for the final memory cell device. The resulting active region structure is shown in FIG. 10B.

Figure 10C:
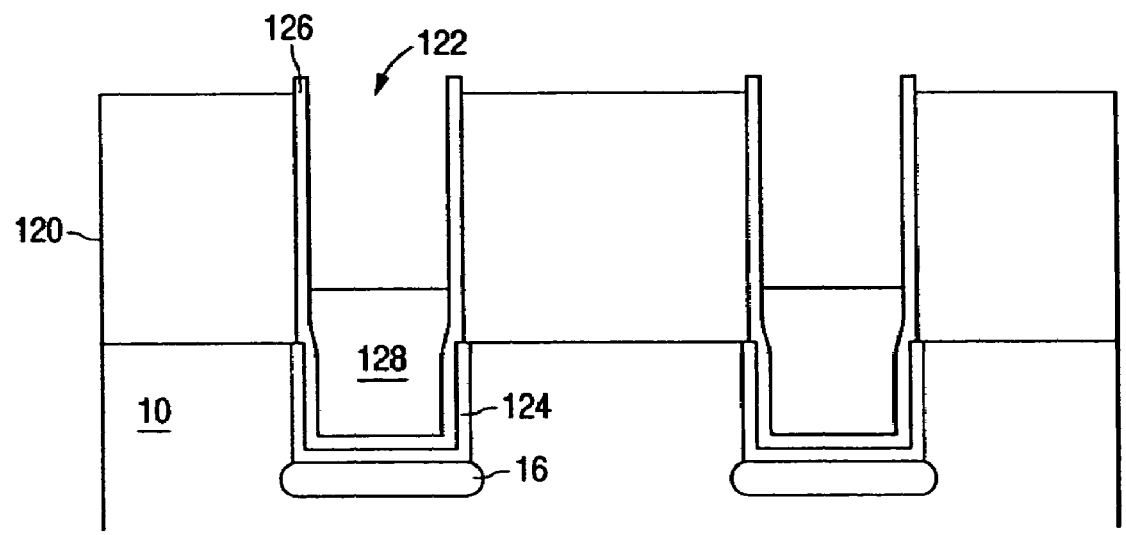

Oxide is formed over the structure, followed by a planarizing oxide etch (e.g. CMP etch using poly layer 126 as an etch stop) which fills trenches 122 with oxide blocks 128. A poly etch follows that removes the exposed portions of poly layer 126 (i.e. those portions over nitride layer 120). An oxide etch is next used to recess the oxide blocks 128 down even with those portions of poly layer 126 left disposed over the STI blocks 106 in the isolation regions 104 (e.g. use poly layer 126 in the inactive regions as an oxide etch stop). The resulting active region structure is shown in FIG. 10C.

Figure 10D:
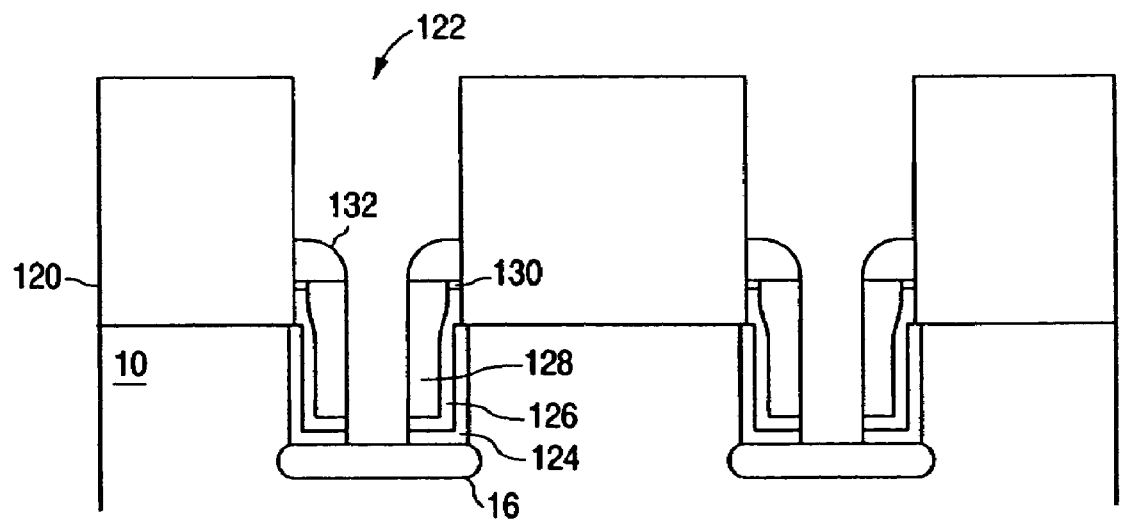

A poly etch is next used to remove exposed portions of poly layer 126 (i.e. along upper portions of trenches 122 in the active regions, and over STI blocks 106 in the isolation regions 104). An oxidation process follows, to form oxide blocks 130 on the exposed end portions of poly layer 126. Dielectric spacers 132 (e.g. oxide) are then formed inside trenches 122 over oxide blocks 130 and partially over oxide blocks 128, via oxide deposition and etch back. Another oxide etch is then used to remove the exposed center portion of oxide blocks 128 (between spacers 132, which are reduced in height by the oxide etch), exposing poly layer 126 at the bottom center of trenches 122. A poly etch and an oxide etch follow to remove the exposed portions of poly layer 126 and oxide layer 124 at the bottom center of trenches 122, exposing portions of the substrate. The resulting active region structure is shown in FIG. 10D.

Figure 10E:
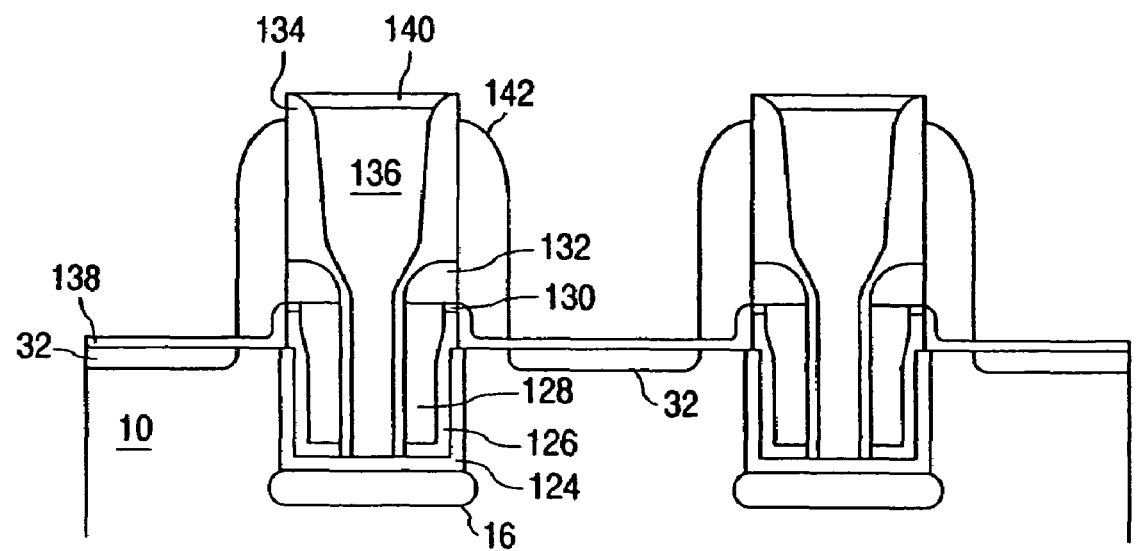

Dielectric spacers 134 are next formed inside trenches 122 by depositing nitride (or oxide) over the structure, followed by an anisotropic etch. Trenches 122 are then filled with poly blocks 136 using a poly deposition and CMP etch back process (using nitride layer 120 as an etch stop). Nitride layer 120 is then removed from the active and isolation regions 102/104 using a nitride etch. Tunnel oxide layer 138 is next formed on the exposed upper edges of poly layer 126 and over the exposed portions of substrate 10, either by thermal oxidation, oxide deposition, or both. This oxide formation step also forms oxide layer 140 on the exposed top surfaces of poly blocks 136. Poly spacers 142 are formed along nitride spacers 134 using a poly deposition and etch back process. Suitable ion implantation (and anneal) is used to form second (drain) regions 32 in the substrate 10. The resulting active region structure is shown in FIG. 10E.

Insulation spacers 144 are formed along poly spacers 142 by insulation material deposition and anisotropic etch (e.g. nitride or oxide). A metal deposition step is then performed, to deposit a metal such as tungsten, cobalt, titanium, nickel, platinum, or molybdenum over the structure, which is then annealed, permitting the hot metal to flow and to seep into the exposed top portions of poly spacers 142 to form a conductive layer of metalized polysilicon 146 (polycide) thereon. The metal deposited on the remaining structure is removed by a metal etch process. Insulation material 148, such as BPSG or oxide, is then formed over the entire structure. A masking step is performed to define etching areas over the drain regions 32. The insulation material 148 (and oxide layer 138) are selectively etched in the masked regions to create contact openings that extend down to and expose drain regions 32. The contact openings are then filled with a conductor metal (e.g. tungsten) to form metal contacts 150 that are electrically connected to drain regions 32. Drain line contacts 152 (e.g. aluminum, copper, etc.) are added by metal masking over the insulation material 148, to connect together all the contacts 150 (and thus all the drain regions 32) in each active region. The final active region memory cell structure is illustrated in FIG. 10F.

Figure 10F:
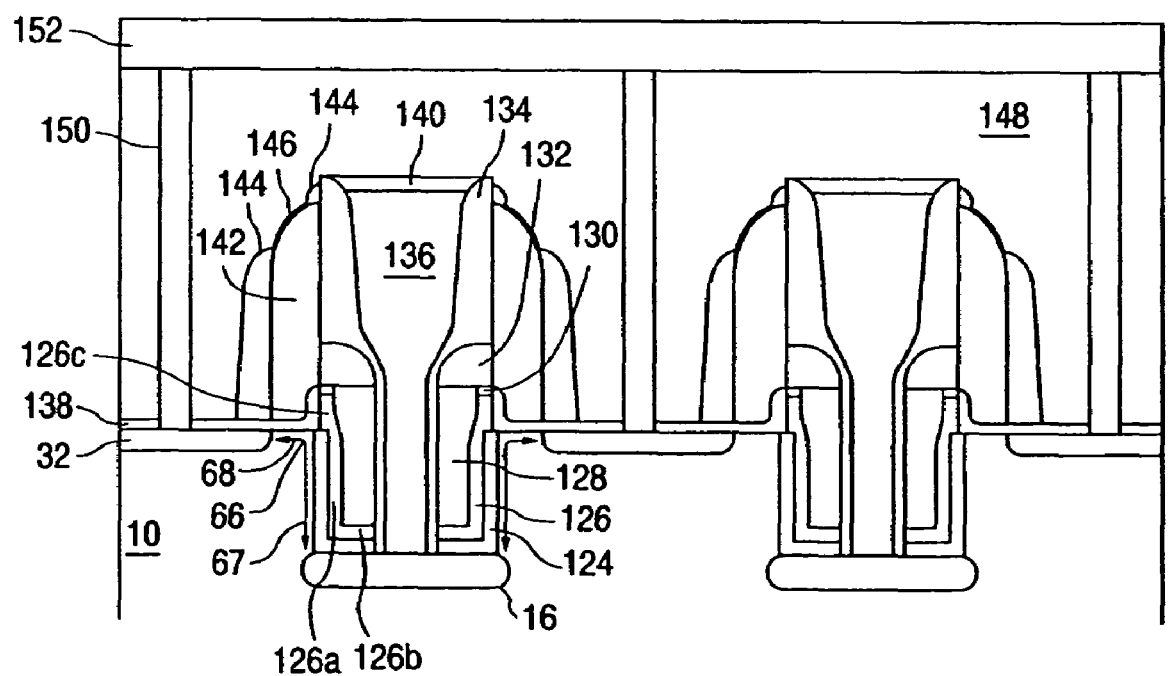

As shown in FIG. 10F, L-shaped poly layer 126 constitutes the floating gate for each of the memory cells. Each floating gate 126 includes a pair of orthogonally oriented elongated portions 126a/126b joined together at their proximal ends. Floating gate portion 126a extends along and is insulated from the substrate sidewall of trench 122, with an upper segment 126c extending above the substrate surface. Floating gate portion 126b extends along and is insulated from a bottom substrate wall of trench 122 (i.e. disposed over and insulated from source region 16). Poly spacer 142 constitutes the memory cell control gate, having a first portion laterally adjacent to and insulated from the floating gate upper segment 126c, and a second portion disposed over and insulated from the upper segment 126c. The floating gate segment 126c has a distal end that terminates in a thin tip portion that directly faces and is insulated from the control gate 142, thus providing a path for Fowler-Nordheim tunneling between the floating gate 126 and the control gate 142.

It should be noted that the ion implantation process discussed above with respect to FIG. 10B for forming source regions 16 can be delayed until after the formation of the structure shown in FIG. 10D. In such a case, source regions 16 are narrower than the width of the trench, thus forming horizontal portions of the channel region underneath the trench 122 (similar to channel region portions 69 shown in FIG. 4G). With such a configuration, the channel regions are longer, and the capacitive coupling between the floating gate and the poly block 136 is relied upon for programming the memory cell.

The fourth alternate embodiment of the present invention provides a memory cell array with reduced size and superior program efficiency. Memory cell size is reduced significantly because the source regions 16 are buried inside the substrate 10, and are self-aligned to the trenches 122, where space is not wasted due to limitations in the lithography generation, contact alignment and contact integrity. Program efficiency is greatly enhanced by "aiming" the horizontal portion 68 of the channel region 66 at the floating gate 126. The L-shaped floating gate configuration of the present invention provides many advantages. Because the floating gate portions 126a/126b are made from a thin layer of poly material, the upper tip thereof is narrow and enhances Fowler-Nordheim tunneling to the control gate 142. There is no need for extensive thermal oxidation steps to form sharp edges for enhanced tunneling. There is also an enhanced voltage coupling ratio between each floating gate portion 126b and the corresponding source region 16 given the proximity of these elements (separated only by thin oxide layer 124). Moreover, having source region 16 and drain region 32 separated vertically as well as horizontally allows easier optimization of reliability parameters without affecting cell size.

It should be noted that for this embodiment, voltage coupling between floating gates 126 and source regions 16 are sufficient, so that additional voltage coupling with poly blocks 136, while favorable, is not necessary. Poly blocks 136 for this embodiment serve mainly to electrically connect all the source regions 16 in each row of paired memory cells together. Therefore, poly blocks 136 can be omitted from this embodiment, so long as an electrical contact similar to contact 150 is formed down to each source region 16. It should also be noted that each poly block 136 needs to be insulated from the substrate as it crosses the isolation regions, so that it does not short to the substrate. This is accomplished by making the depth of STI blocks 106 in the isolation regions deeper than the bottom of trench 122, or by ensuring the material for STI blocks 106 etches slower than the material used to form oxide blocks 128.

It is to be understood that the present invention is not limited to the embodiments described above and illustrated herein, but encompasses any and all variations falling within the scope of the appended claims. For example, trenches 22/122 can end up having any shape that extends into the substrate, not just the elongated rectangular shape shown in the figures. Also, although the foregoing method describes the use of appropriately doped polysilicon as the conductive material used to form the memory cells, it should be clear to those having ordinary skill in the art that any appropriate conductive material can be used. In addition, any appropriate insulator can be used in place of silicon dioxide or silicon nitride. Moreover, any appropriate material whose etch property differs from silicon dioxide (or any insulator) and from polysilicon (or any conductor) can be used in place of silicon nitride. Further, as is apparent from the claims, not all method steps need be performed in the exact order illustrated or claimed, but rather in any order that allows the proper formation of the memory cell of the present invention. Additionally, the above described invention is shown to be formed in a substrate which is shown to be uniformly doped, but it is well known and contemplated by the present invention that memory cell elements can be formed in well regions of the substrate too, which are regions that are doped to have a different conductivity-type compared to other portions of the substrate. It is possible for poly block 18 to instead be made of an insulation material, especially if there is any overlap of the floating gate with the source region. Lastly, single layers of insulating or conductive material could be formed as multiple layers of such materials, and vice versa.

What is claimed is:

1. A method of forming a semiconductor memory cell, comprising:

forming first and second spaced-apart regions in a semiconductor substrate, with a channel region defined in the substrate therebetween having a first portion and a second portion, wherein the substrate has a first conductivity type and a surface, and the first and second regions have a second conductivity type;

forming an electrically conductive floating gate having first and second elongated portions joined together at proximal ends thereof in a non-linear manner, wherein the floating gate first portion is formed to extend along and be insulated from the channel region second portion for controlling a conductivity of the channel region second portion, and wherein the floating gate second portion is positioned for capacitive coupling with the first region;

forming an electrically conductive control gate disposed adjacent to and insulated from the channel region first portion for controlling a conductivity of the channel region first portion; and forming a block of conductive material disposed over and electrically connected to the first region, wherein the floating gate second portion extends along and is insulated from a surface of the conductive material block.

2. The method of claim 1, wherein the control gate is formed with a first portion disposed adjacent to and insulated from a distal end of the floating gate first portion, and with a second portion disposed adjacent to and insulated from the channel region first portion.

3. The method of claim 2, wherein the control gate is formed with a third portion that is disposed over and insulated from a distal end of the floating gate second portion.

4. The method of claim 1, wherein the floating gate second portion is formed to extend in a direction substantially perpendicular to the substrate surface.

5. The method of claim 4, wherein the floating gate is formed with a substantially L-shape.

6. The method of claim 1, wherein the formation of the floating gate includes the steps of:

forming insulation material over the substrate surface, and over and along a side surface of the conductive material block;

forming a layer of conductive material along the insulation material;
forming an insulation spacer on the insulation material, leaving portions of the conductive material layer exposed;
removing the exposed portions of the conductive material layer, wherein the portion of the conductive material layer between the insulation material and the insulation spacer constitutes the floating gate.

7. A method of forming a semiconductor memory cell, comprising:
forming first and second spaced-apart regions in a semiconductor substrate, with a channel region defined in the substrate therebetween having a first portion and a second portion, wherein the substrate has a first conductivity type and a surface, and the first and second regions have a second conductivity type;
forming an electrically conductive floating gate having first and second elongated portions joined together at proximal ends thereof in a non-linear manner, wherein the floating gate first portion is formed to extend along and be insulated from the channel region second portion for controlling a conductivity of the channel region second portion, and wherein the floating gate second portion is positioned for capacitive coupling with the first region;
forming an electrically conductive control gate disposed adjacent to and insulated from the channel region first portion for controlling a conductivity of the channel region first portion; and
forming a trench into the substrate surface, wherein the second region is formed underneath the trench, and wherein the channel region first portion extends substantially along a sidewall of the trench and the channel region second portion extends substantially along the surface of the substrate.

8. The method of claim 7, wherein the control gate is formed with a first portion disposed adjacent to and insulated from a distal end of the floating gate first portion, and with a second portion extending into the trench and disposed adjacent to and insulated from the channel region first portion.

9. The method of claim 7, wherein the channel region first and second portions are non-linear with respect to each other, with the channel region first portion extending in a direction directly toward the floating gate first portion to define a path for programming the floating gate.

10. The method of claim 7, wherein the formation of the control gate includes the steps of:
depositing conductive material into the trench;
forming a spacer of material over a portion of the deposited conductive material, leaving a portion of the deposited conductive material exposed; and
performing an anisotropic etch to remove the exposed portion of the deposited conductive material.

11. A method of forming a semiconductor memory cell, comprising:
forming first and second spaced-apart regions in a semiconductor substrate, with a channel region defined in the substrate therebetween having a first portion and a second portion, wherein the substrate has a first conductivity type and a surface, and the first and second regions have a second conductivity type;
forming an electrically conductive floating gate having first and second elongated portions joined together at proximal ends thereof in a non-linear manner, wherein the floating gate first portion is formed to extend along and be insulated from the channel region second portion for controlling a conductivity of the channel region second portion, and wherein the floating gate second portion is positioned for capacitive coupling with the first region;
forming an electrically conductive control gate disposed adjacent to and insulated from the channel region first portion for controlling a conductivity of the channel region first portion; and
forming a trench into the substrate surface, wherein the second region is formed underneath the trench, and wherein the channel region first portion extends substantially along a sidewall of the trench and the channel region second portion extends substantially along the surface of the substrate;
wherein the channel region further includes a third portion that extends underneath at least a portion of the trench.

12. A method of forming a semiconductor memory cell, comprising:
forming first and second spaced-apart regions in a semiconductor substrate, with a channel region defined in the substrate therebetween having a first portion and a second portion, wherein the substrate has a first conductivity type and a surface, and the first and second regions have a second conductivity type;
forming an electrically conductive floating gate having first and second elongated portions joined together at proximal ends thereof in a non-linear manner, wherein the floating gate first portion is formed to extend along and be insulated from the channel region second portion for controlling a conductivity of the channel region second portion, and wherein the floating gate second portion is positioned for capacitive coupling with the first region;
forming an electrically conductive control gate disposed adjacent to and insulated from the channel region first portion for controlling a conductivity of the channel region first portion; and
forming a trench into the substrate surface, wherein the first region is formed underneath the, trench, and wherein the channel region second portion extends substantially along a sidewall of the trench and the channel region first portion extends substantially along the surface of the substrate.

13. A method of forming a semiconductor memory cell, comprising:
forming first and second spaced-apart regions in a semiconductor substrate, with a channel region defined in the substrate therebetween having a first portion and a second portion, wherein the substrate has a first conductivity type and a surface, and the first and second regions have a second conductivity type;
forming an electrically conductive floating gate having first and second elongated portions joined together at proximal ends thereof in a non-linear manner, wherein the floating gate first portion is formed to extend along and be insulated from the channel region second portion for controlling a conductivity of the channel region second portion, and wherein the floating gate second portion is positioned for capacitive coupling with the first region;
forming an electrically conductive control gate disposed adjacent to and insulated from the channel region first portion for controlling a conductivity of the channel region first portion; and
forming a trench into the substrate surface, wherein the first region is formed underneath the trench, and wherein the channel region second portion extends substantially along a sidewall of the trench and the channel region first portion extends substantially along the surface of the substrate;

wherein the floating gate second portion is formed to extend over and be insulated from a bottom surface of the trench, and wherein the floating gate first portion is formed to extend along and be insulated from the sidewall of the trench.

14. The method of claim 13, wherein the floating gate first portion is formed with an upper segment that extends above the substrate surface, and wherein the control gate is formed laterally adjacent to and insulated from the floating gate upper segment.

15. The method of claim 14, wherein the control gate is formed with a portion thereof that is disposed over and insulated from a distal end of the floating gate upper segment.

16. The method of claim 13, wherein the formation of the floating gate includes the steps of:
    forming insulation material along the sidewall and bottom surface of the trench;
    forming a layer of conductive material along the insulation material;
    forming an insulation spacer on the insulation material, leaving portions of the conductive material layer exposed; and
    removing the exposed portions of the conductive material layer, wherein the portion of the conductive material layer between the insulation material and the insulation spacer constitutes the floating gate.

17. The method of claim 13, further comprising the step of:
    forming a block of conductive material having at least a lower portion thereof disposed in the trench laterally adjacent to and insulated from the floating gate.

18. The method of claim 17, wherein the lower portion of the conductive material block is formed over and insulated from the first region.

19. A method of forming an array of semiconductor memory cells, comprising:
    forming a plurality of first and second spaced-apart regions of a second conductivity type in a semiconductor substrate of a first conductivity type, with a plurality of channel regions each defined in the substrate between one of the first regions and one of the second regions, wherein each channel region includes a first portion and a second portion, and wherein the substrate has a surface;
    forming a plurality of electrically conductive floating gates each having first and second elongated portions joined together at proximal ends thereof in a non-linear manner, wherein each of the floating gate first portions is formed to extend along and be insulated from one of the channel region second portions for controlling a conductivity of the one channel region second portion, and wherein each of the floating gate second portions is positioned for capacitive coupling with one of the first regions;
    forming a plurality of electrically conductive control gates each disposed adjacent to and insulated from one of the channel region first portions for controlling a conductivity of the one channel region first portion; and
    forming a plurality of conductive material blocks each disposed over and electrically connected to one of the first regions, wherein each of the floating gate second portions extends along and is insulated from a surface of one of the conductive material blocks.

20. The method of claim 19, wherein each of the control gates is formed with a first portion disposed adjacent to and insulated from a distal end of one of the floating gate first portions, and with a second portion disposed adjacent to and insulated from one of the channel region first portions.

21. The method of claim 20, wherein each of the control gates is formed with a third portion that is disposed over and insulated from a distal end of one of the floating gate second portions.

22. The method of claim 19, wherein each of the floating gate second portions is formed to extend in a direction substantially perpendicular to the substrate surface.

23. The method of claim 22, wherein each of the floating gates is formed with a substantially L-shape.

24. The method of claim 19, wherein the formation of the floating gates includes the steps of:
    forming insulation material over the substrate surface, and over and along side surfaces of the conductive material blocks;
    forming a layer of conductive material along the insulation material;
    forming insulation spacers on the insulation material, leaving portions of the conductive material layer exposed; and
    removing the exposed portions of the conductive material layer, wherein the portions of the conductive material layer between the insulation material and the insulation spacers constitute the floating gates.

25. A method forming an array of semiconductor memory cells, comprising:
    forming a plurality of first and second spaced-apart regions of a second conductivity type in a semiconductor substrate of a first conductivity type, with a plurality of channel regions each defined in the substrate between one of the first regions and one of the second regions, wherein each channel region includes a first portion and a second portion, and wherein the substrate has a surface;
    forming a plurality of electrically conductive floating gates each having first and second elongated portions joined together at proximal ends thereof in a non-linear manner, wherein each of the floating gate first portions is formed to extend along and be insulated from one of the channel region second portions for controlling a conductivity of the one channel region second portion, and wherein each of the floating gate second portions is positioned for capacitive coupling with one of the first regions;
    forming a plurality of electrically conductive control gates each disposed adjacent to and insulated from one of the channel region first portions for controlling a conductivity of the one channel region first portion; and
    forming a plurality of trenches into the substrate surface, wherein each of the second regions is formed underneath one of the trenches, and wherein each of the channel region first portions extends substantially along a sidewall of one of the trenches and each of the channel region second portions extends substantially along the surface of the substrate.

26. The method of claim 25, wherein each of the control gates is formed with a first portion disposed adjacent to and insulated from a distal end of one of the floating gate first portions, and with a second portion extending into one of the trenches and disposed adjacent to and insulated from one of the channel region first portions.

27. The method of claim 25, wherein for each of the channel regions the first and second portions thereof are non-linear with respect to each other, with the channel region first portion extending in a direction directly toward one of the floating gate first portions to define a path for programming the one floating gate.

28. The method of claim 25, wherein the formation of the control gates includes the steps of:
  depositing conductive material into the trenches;
  forming spacers of material over portions of the deposited conductive material, leaving portions of the deposited conductive material exposed; and
  performing an anisotropic etch to remove the exposed portions of the deposited conductive material.

29. A method of forming an array of semiconductor memory cells, comprising:
  forming a plurality of first and second spaced-apart regions of a second conductivity type in a semiconductor substrate of a first conductivity type, with a plurality of channel regions each defined in the substrate between one of the first regions and one of the second regions, wherein each channel region includes a first portion and a second portion, and wherein the substrate has a surface;
  forming a plurality of electrically conductive floating gates each having first and second elongated portions joined together at proximal ends thereof in a non-linear manner, wherein each of the floating gate first portions is formed to extend along and be insulated from one of the channel region second portions for controlling a conductivity of the one channel region second portion, and wherein each of the floating gate second portions is positioned for capacitive coupling with one of the first regions;
  forming a plurality of electrically conductive control gates each disposed adjacent to and insulated from one of the channel region first portions for controlling a conductivity of the one channel region first portion; and
  forming a plurality of trenches into the substrate surface, wherein each of the second regions is formed underneath one of the trenches, and wherein each of the channel region first portions extends substantially along a sidewall of one of the trenches and each of the channel region second portions extends substantially along the surface of the substrate;
  wherein each of the channel regions further includes a third portion that extends underneath at least a portion of one of the trenches.

30. A method of forming an array of semiconductor memory cells, comprising:
  forming a plurality of first and second spaced-apart regions of a second conductivity type in a semiconductor substrate of a first conductivity type, with a plurality of channel regions each defined in the substrate between one of the first regions and one of the second regions, wherein each channel region includes a first portion and a second portion, and wherein the substrate has a surface;
  forming a plurality of electrically conductive floating gates each having first and second elongated portions joined together at proximal ends thereof in a non-linear manner, wherein each of the floating gate first portions is formed to extend along and be insulated from one of the channel region second portions for controlling a conductivity of the one channel region second portion, and wherein each of the floating gate second portions is positioned for capacitive coupling with one of the first regions;
  forming a plurality of electrically conductive control gates each disposed adjacent to and insulated from one of the channel region first portions for controlling a conductivity of the one channel region first portion; and
  forming a plurality of trenches into the substrate surface, wherein each of the first regions is formed underneath one of the trenches, and wherein each of the channel region second portions extends substantially along a sidewall of one of the trenches and each of the channel region first portions extends substantially along the surface of the substrate.

31. A method of forming an array of semiconductor memory cells, comprising:
  forming a plurality of first and second spaced-apart regions of a second conductivity type in a semiconductor substrate of a first conductivity type, with a plurality of channel regions each defined in the substrate between one of the first regions and one of the second regions, wherein each channel region includes a first portion and a second portion, and wherein the substrate has a surface;
  forming a plurality of electrically conductive floating gates each having first and second elongated portions joined together at proximal ends thereof in a non-linear manner, wherein each of the floating gate first portions is formed to extend along and be insulated from one of the channel region second portions for controlling a conductivity of the one channel region second portion, and wherein each of the floating gate second portions is positioned for capacitive coupling with one of the first regions;
  forming a plurality of electrically conductive control gates each disposed adjacent to and insulated from one of the channel region first portions for controlling a conductivity of the one channel region first portion; and
  forming a plurality of trenches into the substrate surface, wherein each of the first regions is formed underneath one of the trenches, and wherein each of the channel region second portions extends substantially along a sidewall of one of the trenches and each of the channel region first portions extends substantially along the surface of the substrate;
  wherein each of the floating gate second portions is formed to extend over and be insulated from a bottom surface of one of the trenches, and wherein each of the floating gate first portions is formed to extend along and be insulated from the sidewall of one of the trenches.

32. The method of claim 31, wherein each of the floating gate first portions is formed with an upper segment that extends above the substrate surface, and wherein each of the control gates is formed laterally adjacent to and insulated from one of the floating gate upper segments.

33. The method of claim 32, wherein each of the control gates is formed with a portion thereof that is disposed over and insulated from a distal end of one of the floating gate upper segments.

34. The method of claim 31, wherein the formation of the floating gates includes the steps of:
  forming insulation material along the sidewalls and bottom surfaces of the trenches;
  forming a layer of conductive material along the insulation material;

forming insulation spacers on the insulation material, leaving portions of the conductive material layer exposed; and removing the exposed portions of the conductive material layer, wherein the portions of the conductive material layer between the insulation material and the insulation spacers constitute the floating gates.

35. A method of forming an array of semiconductor memory cells, comprising:

forming a plurality of first and second spaced-apart regions of a second conductivity type in a semiconductor substrate of a first conductivity type, with a plurality of channel regions each defined in the substrate between one of the first regions and one of the second regions, wherein each channel region includes a first portion and a second portion, and wherein the substrate has a surface;

forming a plurality of electrically conductive floating gates each having first and second elongated portions joined together at proximal ends thereof in a non-linear manner, wherein each of the floating gate first portions is formed to extend along and be insulated from one of the channel region second portions for controlling a conductivity of the one channel region second portion, and wherein each of the floating gate second portions is positioned for capacitive coupling with one of the first regions;

forming a plurality of electrically conductive control gates each disposed adjacent to and insulated from one of the channel region first portions for controlling a conductivity of the one channel region first portion; and forming a plurality of trenches into the substrate surface, wherein each of the first regions is formed underneath one of the trenches, and wherein each of the channel region second portions extends substantially along a sidewall of one of the trenches and each of the channel region first portions extends substantially along the surface of the substrate;

forming a plurality of blocks of conductive material each having at least a lower portion thereof disposed in one of the trenches laterally adjacent to and insulated from one of the floating gates.

36. The method of claim 35, wherein the lower portion of each of the conductive material blocks is formed over and insulated from one of the first regions.

* * * * *